(12) United States Patent
Taniguchi et al.

(10) Patent No.: US 7,977,400 B2
(45) Date of Patent: Jul. 12, 2011

(54) PHOTOSENSITIVE RESIN COMPOSITION

(75) Inventors: Ryuichiro Taniguchi, Kyoto (JP); Hiroko Mitsui, Otsu (JP); Mitsuhito Suwa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 853 days.

(21) Appl. No.: 11/886,339

(22) PCT Filed: Mar. 14, 2006

(86) PCT No.: PCT/JP2006/304938
§ 371 (c)(1),
(2), (4) Date: Jan. 11, 2008

(87) PCT Pub. No.: WO2006/098291
PCT Pub. Date: Sep. 21, 2006

(65) Prior Publication Data
US 2008/0108723 A1  May 8, 2008

(30) Foreign Application Priority Data
Mar. 15, 2005 (JP) .................................. 2005-072674

(51) Int. Cl.
*C08F 2/50* (2006.01)
(52) U.S. Cl. ........ 522/164; 522/100; 522/143; 522/144; 522/162; 522/173; 522/176; 430/270.1; 430/280.1; 430/281.1
(58) Field of Classification Search .................. 522/100, 522/134, 144, 162, 164, 173, 176; 430/270.1, 430/280.1, 281.1
See application file for complete search history.

(56) References Cited

U.S. PATENT DOCUMENTS

| | | |
|---|---|---|
| 2004/0048978 A1 | 3/2004 | Okada et al. |
| 2004/0265731 A1 | 12/2004 | Okada et al. |
| 2006/0159839 A1 | 7/2006 | Suwa |

FOREIGN PATENT DOCUMENTS

| | | |
|---|---|---|
| EP | 0355927 A2 | 2/1990 |
| EP | 0 421 195 A2 | 4/1991 |
| EP | 1 199 604 A1 | 4/2002 |
| JP | 54-109828 A | 8/1979 |
| JP | 3-220558 A | 9/1991 |
| JP | 10-316751 A | 12/1998 |
| JP | 11-24268 A | 1/1999 |
| JP | 11-282155 A | 10/1999 |
| JP | 2002-121207 A | 3/2002 |
| JP | 2002-182378 A | 6/2002 |
| JP | 2002-268215 A | 9/2002 |
| JP | 2003-98667 A | 4/2003 |
| JP | 2003-140339 A | 5/2003 |
| JP | 2003-248306 A | 9/2003 |
| JP | 2004-294553 A | 10/2004 |
| WO | WO-2004/109403 A1 | 12/2004 |

*Primary Examiner* — Sanza L McClendon
(74) *Attorney, Agent, or Firm* — Birch, Stewart, Kolasch & Birch, LLP

(57) ABSTRACT

Using a photosensitive resin composition comprising a polyimide (a) having, at the end of the main chain, at least one group selected from the group consisting of a carboxyl group, a phenolic hydroxyl group, a sulfonic acid group and a thiol group, an unsaturated bond-containing polymerizable compound (b1) represented by the general formula (1), and a photopolymerization initiator (c), it is possible to conduct alkaline development and to form a polyimide film having excellent heat resistance, strength and elongation.

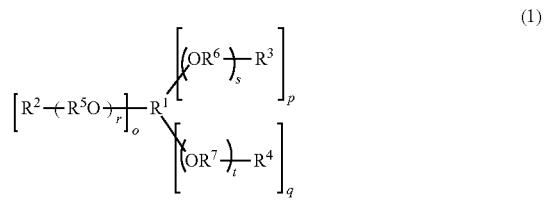

(1)

5 Claims, No Drawings

PHOTOSENSITIVE RESIN COMPOSITION

TECHNICAL FIELD

The present invention relates to a photosensitive resin composition which is suited for use as a surface protective film of a semiconductor device, an interlayer insulating film, an insulating layer of an organic electroluminescence element, and a wiring protective insulating film of a circuit board. More particularly, the present invention relates to a negative photosensitive resin composition which is easily soluble in an aqueous alkaline solution before exposure and becomes insoluble in an aqueous alkaline solution after exposure.

BACKGROUND ART

A circuit pattern is formed on a semiconductor integrated circuit or a printed board through a multitude of complicated steps of forming a film of a resist material on the surface of a base material, exposing a predetermined portion to light, removing an unnecessary portion through etching, and washing the surface of a substrate. Therefore, in the semiconductor industry, a resist at a necessary portion has recently been left and used as an insulating material as it is even after formation of a pattern through exposure and development so as to decrease the steps.

As the material, for example, heat resistant photosensitive materials such as a photosensitive polyimide and a photosensitive polybenzoxazole have been developed and put into practical use. Particularly, negative photosensitive polyimides to be developed with an organic solvent are used by many device manufacturers because of excellent heat resistance and ease of removal of impurities. With respect to these negative photosensitive polyimides, there is known a method in which a compound having a photosensitive group is added to or mixed with a polyimide precursor and a pattern is formed by a photocrosslinking reaction. However, these negative photosensitive polyimides do not cope with development with an aqueous alkaline solution (for example, development with an aqueous sodium tetramethylammonium solution) which has recently been used from consideration for the environment because of its material design coping basically to development with an organic solvent. Therefore, since the negative photosensitive polyimides are inferior in solubility in the case of developing with an aqueous alkaline solution, it was difficult to form a pattern. To obtain a negative photosensitive polyimide which can be developed with an aqueous alkaline solution, it is required to include an alkaline soluble group, and thus there is proposed an alkaline negative development type photosensitive polyimide precursor in which a photoreactive group is introduced into a portion of the alkaline soluble groups of a polyimide precursor. However, in this technique, since solubility in an alkaline developing solution of a polyimide precursor deteriorates as a result of introduction of a photoreactive group, it was difficult to form a pattern having a favorable shape with good reproductivity after development. Even if a pattern having a favorable shape can be formed, in the case where the polyimide precursor is finally converted into a polyimide, large curing shrinkage of the film involved in a ring closure reaction occurs. In the case of using in the form of a thick film having a thickness of 20 μm or more, cracking occurred and thus it was difficult to use.

Therefore, there is proposed a method in which no photoreactive group is introduced into the polymer and a photo acid generator, or a photo acid generator and an acid crosslinking agent are added to obtain a photosensitive polyimide composition (see, for example, Patent Document 1 and Patent Document 2). However, according to these methods, it was difficult to form a minute pattern having a shape with good reproductivity.

Also, there is proposed a method in which a polymerizable compound and a photopolymerization initiator are added to a binder polymer to obtain a negative pattern (see, for example, Patent Documents 3 to 6). However, according to these methods, a favorable pattern was not obtained, or a film having sufficient strength, elongation or heat resistance could not be obtained, sometimes.

[Patent Document 1] Japanese Unexamined Patent Publication (Kokai) No. 2003-98667 (pages 1-4)
[Patent Document 2] Japanese Unexamined Patent Publication (Kokai) No. 10-316751 (pages 1-4)
[Patent Document 3] Japanese Unexamined Patent Publication (Kokai) No. 2002-268215 (pages 1-3)
[Patent Document 4] Japanese Unexamined Patent Publication (Kokai) No. 2003-248306 (pages 1-3)
[Patent Document 5] Japanese Unexamined Patent Publication (Kokai) No. 2004-294553 (pages 1-4)
[Patent Document 6] Japanese Unexamined Patent Publication (Kokai) No. 2003-140339 (pages 1-3)

DISCLOSURE OF THE INVENTION

An object of the present invention is to provide a photosensitive resin composition which enables development with an aqueous alkaline solution and can form a polyimide film having excellent heat resistance, strength and elongation.

The present invention provides a photosensitive resin composition comprising a polyimide (a) having, at the end of the main chain, at least one group selected from the group consisting of a carboxyl group, a phenolic hydroxyl group, a sulfonic acid group and a thiol group, an unsaturated bond-containing polymerizable compound (b1) represented by the general formula (1), and a photopolymerization initiator (c):

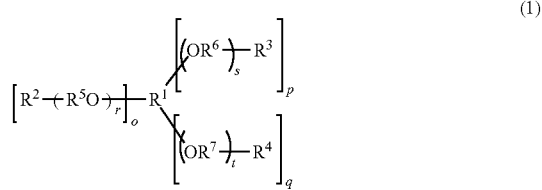

wherein $R^1$ represents a mono- to tri-valent organic group having at least one aromatic ring; $R^2$ to $R^4$ represent a polymerizable group having an unsaturated bond; $R^5$ to $R^7$ represent a di-valent organic group; $R^2$ to $R^4$ and $R^5$ to $R^7$ may be the same or different; o, p and q represent an integer from 0 to 1; and r, s and t each independently represents an integer from 1 to 10, provided that $o+p+q \geq 1$.

According to the present invention, it is possible to obtain a photosensitive resin composition which enables development with an aqueous alkaline solution and does not require imidation of a polymer through a high-temperature heat treatment, and also has excellent pattern processability. Using this photosensitive resin composition, a heat resistant resin composition film, which has excellent heat resistance, strength and elongation, can be formed. Furthermore, by using in combination with an unsaturated bond-containing polymerizable compound having an alicyclic hydrocarbon group, a negative photosensitive resin composition with high resolution can be obtained.

BEST MODE FOR CARRYING OUT THE INVENTION

The photosensitive resin composition of the present invention contains a polyimide (a) having, at the end of the main chain, at least one group selected from the group consisting of a carboxyl group, a phenolic hydroxyl group, a sulfonic acid group and a thiol group, an unsaturated bond-containing polymerizable compound (b1) represented by the general formula (1), and a photopolymerization initiator (c). This photosensitive resin composition is easily soluble in an alkaline developing solution before exposure and becomes insoluble in an alkaline developing solution after exposure, and thus it can form a pattern with small thickness loss as a result of the development. Since this photosensitive resin composition contains a polyimide, it is not necessary to convert a polyimide precursor into a polyimide through a ring closure reaction by heating or a suitable catalyst. Therefore, the photosensitive resin composition does not require a high-temperature treatment and also gives small stress due to curing shrinkage involved in imide ring closure reaction, and thus heat shrinkability and cracking resistance upon curing are improved. Furthermore, the photosensitive resin composition has excellent stress resistance of the cured polyimide film and is therefore easily capable of forming a thick film as compared with a resin composition containing a polyimide precursor.

The polyimide as the component (a) has at least one group selected from the group consisting of a carboxyl group, a phenolic hydroxyl group, a sulfonic acid group and a thiol group. The polyimide has alkaline solubility because these alkaline soluble groups are present at the end of the main chain. Taking account of practicability to an alkaline developing solution used in the semiconductor industry, a polyimide having a phenolic hydroxyl group or a thiol group is particularly preferable.

The polyimide as the component (a) has at least one alkaline soluble group described above at the end of the main chain. The alkaline soluble group can be introduced at the end of the main chain by enabling an end capping agent to have an alkaline soluble group. The polyimide is not specifically limited, and it is preferred to contain one or more kinds of polyimides represented by the following general formulas (2) to (5).

[Chemical Formula 2]

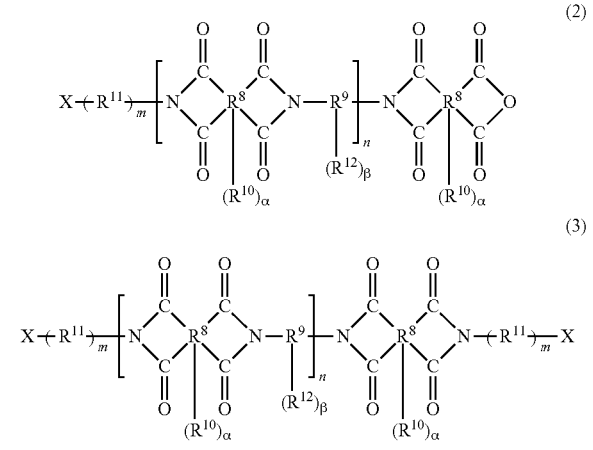

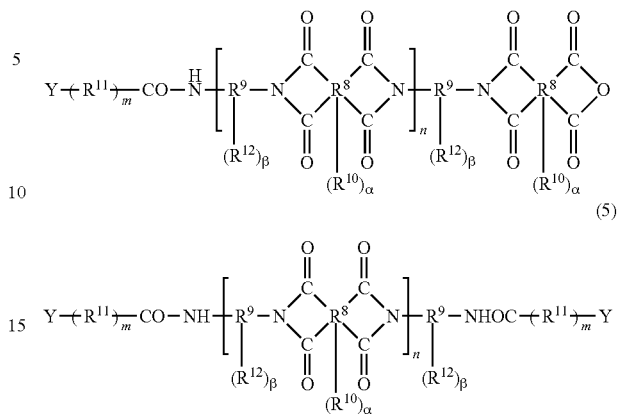

In the above formulas, X is a mono-valent aromatic group or a cyclic aliphatic group, which has at least one group selected from the group consisting of a carboxyl group, a phenolic hydroxyl group, a sulfonic acid group and a thiol group. X preferably has a phenolic hydroxyl group or a thiol group.

Y is a mono-valent organic group having at least one group selected from a carboxyl group, a phenolic hydroxyl group, a sulfonic acid group and a thiol group. Preferably, it is a mono-valent organic group having at least one of a phenolic hydroxyl group and a thiol group.

n represents a repeating number of a structural unit of a polymer n is within a range from 3 to 200, and preferably from 5 to 100. When n is within a range from 3 to 200, it becomes possible to use the photosensitive resin composition of the present invention in the form of a thick film, and also sufficient solubility can be imparted to an alkaline developing solution and pattern processing can be conducted.

In the above general formulas (2) to (5), $R^8$ represents a structural component derived from an acid dianhydride and is a tetra- to tetradeca-valent organic group. An organic group having 5 to 40 carbon atoms, which contains an aromatic group or a cyclic aliphatic group, is particularly preferred.

Specific examples of the acid dianhydride include aromatictetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 9,9-bis(3,4-dicarboxyphenyl)fluorene acid dianhydride, 9,9-bis{4-(3,4-dicarboxyphenoxy)phenyl}fluorene acid dianhydride, 2,3,6,7-naphthalenetetracarboxylic dianhydride, 2,3,5,6-pyridinetetracarboxylic dianhydride, 3,4,9,10-perylenetetracarboxylic dianhydride, and 2,2-bis(3,4-dicarboxyphenyl)hexafluoropropane dianhydride; aliphatic tetracarboxylic dianhydrides such as butanetetracarboxylic dianhydride and 1,2,3,4-cyclopentanetetracarboxylic dianhydride; and acid dianhydrides having a structure shown below.

[Chemical Formula 3]

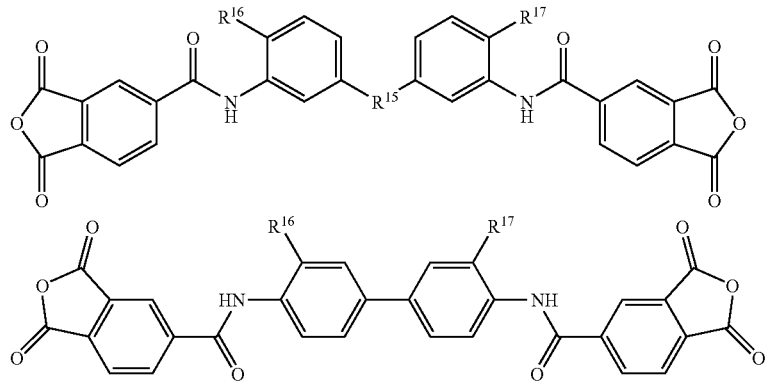

In the above formulas, $R^{15}$ represents a group selected from an oxygen atom, $C(CF_3)_2$, $C(CH_3)_2$ and $SO_2$, and $R^{16}$ and $R^{17}$ each represents a group selected from a hydrogen atom, a hydroxyl group, and a thiol group.

Of these acid dianhydrides, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl)ether dianhydride, 2,2-bis(3,4-dicarboxyphenyl)hexafluoropropane dianhydride, 9,9-bis(3,4-dicarboxyphenyl)fluorene dianhydride, 9,9-bis{4-(3,4-dicarboxyphenoxy)phenyl}fluorene dianhydride, and an acid dianhydride having a structure shown below are preferred. These acid dianhydrides can be used alone, or two or more kinds of them can be used in combination.

[Chemical Formula 4]

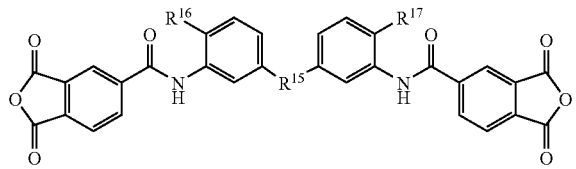

In the above formula, $R^{15}$ represents a group selected from an oxygen atom, $C(CF_3)_2$, $C(CH_3)_2$ and $SO_2$, and $R^{16}$ and $R^{17}$ represent a group selected from a hydrogen atom, a hydroxyl group, and a thiol group.

In the above general formulas (2) to (5), $R^9$ represents a structural component derived from a diamine and is a di- to dodeca-valent organic group. An organic group having 5 to 40 carbon atoms, which contains an aromatic group or a cyclic aliphatic group, is particularly preferred.

Specific examples of the diamine include 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, and 9,9-bis(4-aminophenyl)fluorene; compounds in which these aromatic rings are substituted with an alkyl group or a halogen atom; aliphatic cyclohexyldiamine and methylenebiscyclohexylamine; and a diamine having a structure shown below.

[Chemical Formula 5]

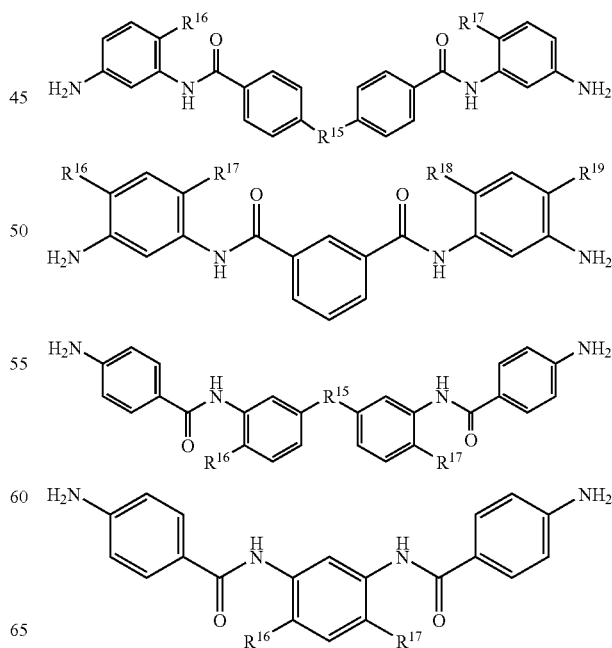

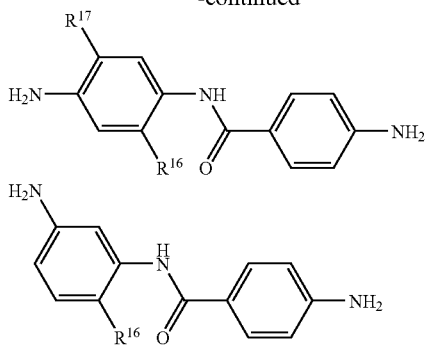

In the above formula, $R^{15}$ represents a group selected from an oxygen atom, $C(CF_3)_2$, $C(CH_3)_2$ and $SO_2$, and $R^{16}$ to $R^{19}$ each represents a group selected from a hydrogen atom, a hydroxyl group, and a thiol group.

Of these diamines, 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, m-phenylenediamine, p-phenylenediamine, 1,4-bis(4-aminophenoxy)benzene, 9,9-bis(4-aminophenyl)fluorene, and a diamine having a structure shown below are preferred.

[Chemical Formula 6]

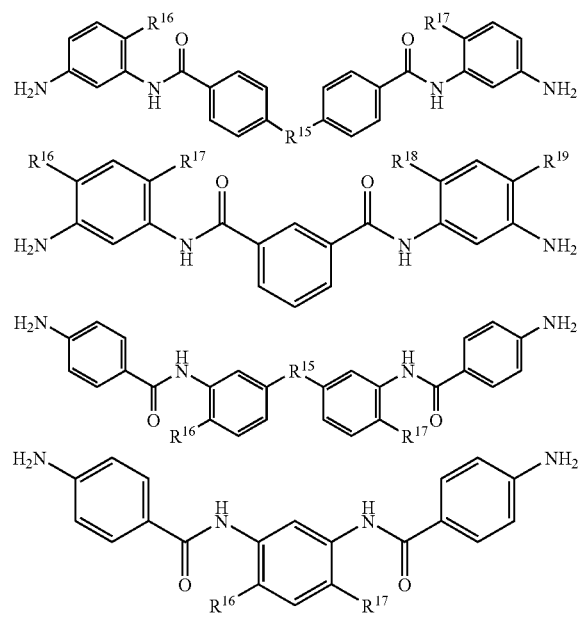

In the above formula, $R^{15}$ represents a group selected from an oxygen atom, $C(CF_3)_2$, $C(CH_3)_2$ and $SO_2$, and $R^{16}$ to $R^{19}$ represent a group selected from a hydrogen atom, a hydroxyl group and a thiol group.

Of these diamines, 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 1,4-bis(4-aminophenoxy)benzene, and a diamine having a structure shown below are particularly preferred. These diamines are used alone, or two or more kinds of them are used in combination.

[Chemical Formula 7]

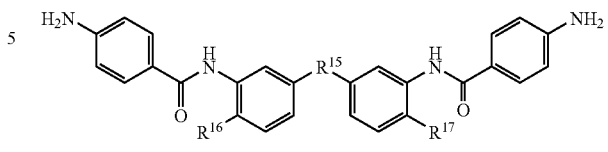

In the above formula, $R^{15}$ represents a group selected from an oxygen atom, $C(CF_3)_2$, $C(CH_3)_2$ and $SO_2$, and $R^{16}$ and $R^{17}$ represent a group selected from a hydrogen atom, a hydroxyl group and a thiol group.

In the general formulas (2) to (5), $R^{10}$ and $R^{12}$ each represents an organic group having at least one group selected from the group consisting of a hydrogen atom, a phenolic hydroxyl group, a sulfonic acid group, a thiol group and an organic group having 1 to 20 carbon atoms. In view of stability of the resulting photosensitive resin composition solution, $R^{10}$ and $R^{12}$ preferably represent a hydrogen atom or an organic group having 1 to 20 carbon atoms. In view of solubility of an aqueous alkaline solution, $R^{10}$ and $R^{12}$ preferably represent a group selected from the group of an alkaline soluble group consisting of a phenolic hydroxyl group, a sulfonic acid group and a thiol group.

In the present invention, a phenolic hydroxyl group, a sulfonic acid group or a thiol group can coexist with a hydrogen atom or an alkyl group.

Since the dissolution rate of a polyimide to an aqueous alkaline solution varies by adjusting an amount of an alkaline soluble group represented by $R^{10}$ and $R^{12}$ and that of a hydrogen atom or an organic group, a negative photosensitive resin composition having a proper dissolution rate can be obtained. An alkaline soluble group preferably accounts for 5 to 100 mol % of $R^{10}$ and $R^{12}$. When the number of carbon atoms of a substituent represented by $R^{10}$ and $R^{12}$ is more than 20, it becomes impossible to dissolve the resulting negative photosensitive resin composition in an aqueous alkaline solution. Consequently, it is more preferred that $R^{10}$ and $R^{12}$ include at least one hydrogen atom or hydrocarbon group having 1 to 20 carbon atoms, and the others are alkaline soluble groups.

In the general formulas (2) and (3), —N—$(R^{11})_m$—X preferably has a structure represented by the following general formula (7).

Also, —CO—$(R^{11})_m$—Y as structural components of the general formulas (4) and (5) preferably has a structure represented by the following general formula (8) or (9). Either or both of the end capping groups represented by the general formulas (8) and (9) may be included.

[Chemical Formula 8]

(7)

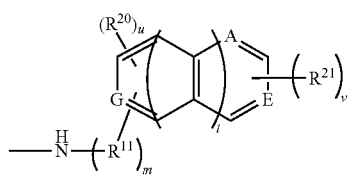

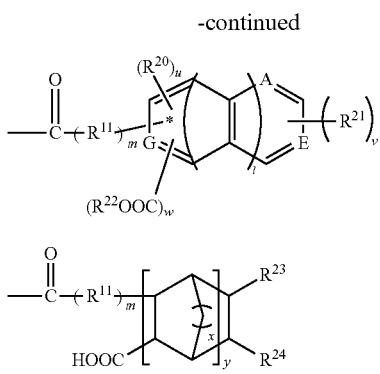

(9)

$$—\overset{O}{\underset{\|}{C}}{-}(R^{11})_{m}{-}\left[\begin{array}{c}\phantom{x}\\\phantom{x}\end{array}\right]_{y}\begin{array}{c}R^{23}\\R^{24}\end{array}$$
HOOC In the above formulas, $R^{11}$ represents a noncyclic di-valent organic group, of which a di-valent group selected from the group consisting of —$CR^{25}R^{26}$—, —$CH_2O$— and —$CH_2SO_2$— is preferred. $R^{25}$ and $R^{26}$ represent a mono-valent group selected from the group consisting of a hydrogen atom, a hydroxyl group and a hydrocarbon group having 1 to 10 carbon atoms. $R^{20}$ and $R^{21}$ each represents a group selected from the group consisting of a hydrogen atom, a hydroxyl group, a carboxyl group, a sulfonic acid group, a thiol group and a hydrocarbon group having 1 to 10 carbon atoms, and at least one of them is a hydroxyl group, a carboxyl group, a sulfonic acid group or a thiol group. $R^{22}$ represents a mono-valent group selected from the group consisting of a hydrogen atom and a hydrocarbon group having 1 to 10 carbon atoms. Of these groups, a hydrogen atom or a hydrocarbon group having 1 to 4 carbon atoms is preferred and a hydrogen atom, a methyl group or a t-butyl group is particularly preferred. $R^{23}$ and $R^{24}$ each represents a mono-valent group selected from the group consisting of a hydrogen atom and a hydrocarbon group having 1 to 4 carbon atoms, or a ring structure formed by direct bonding of $R^{23}$ and $R^{24}$ (for example, a nadiimide ring, etc.). A, E and G each represents a carbon atom or a nitrogen atom and may be the same or different. m is an integer from 0 to 10, and preferably an integer from 0 to 4. l is 0 or 1, and preferably 0. u is 0 or 1, and preferably 0. v is an integer from 1 to 3, and preferably 1 or 2. w is 0 or 1. x and y each represents 0 or 1.

In the general formulas (2) and (3), —N—$(R^{11})_m$—X is derived from a primary monoamine which is an end capping agent.

Specific examples of the primary monoamine used as the end capping agent include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxy-pyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, and 4-aminothiophenol.

Of these primary monoamines, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol are preferred. These primary monoamines are used alone, or two or more kinds of them are used in combination.

In the general formulas (4) and (5), —CO—$(R^{11})_m$—Y is derived from the end capping agent such as an acid anhydride, a monocarboxylic acid, a monoacid chloride compound or a mono-active ester compound.

Specific examples of the compound selected from an acid anhydride, a monocarboxylic acid, a monoacid chloride compound and a mono-active ester compound to be used as the end capping agent include acid anhydrides such as phthalic anhydride, maleic anhydride, nadic anhydride, cyclohexanedicarboxylic anhydride, and 3-hydroxyphthalic anhydride; monocarboxylic acids such as 2-carboxyphenyl, 3-carboxyphenyl, 4-carboxyphenyl, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, and 4-carboxybenzenesulfonic acid, and monoacid chloride compounds prepared by acid chloridation of these carboxyl groups; monoacid chloride compounds prepared by acid chloridation of only a monocarboxyl group of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7- dicarboxynaphthalene, 1,8-dicarboxynaphthalene, 2,3-dicarboxynaphthalene, 2,6-dicarboxynaphthalene, and 2,7-dicarboxynaphthalene; and active ester compounds obtained by reacting monoacid chloride compounds with N-hydroxybenzotriazole or N-hydroxy-5-norbornene-2,3-dicarboximide.

Of these compounds, acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenyl, 4-carboxyphenyl, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds prepared by acid chloridation of these carboxyl groups; monoacid chloride compounds prepared by acid chloridation of only a monocarboxyl group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene; and active ester compounds obtained by reacting monoacid chloride compounds with N-hydroxybenzotriazole or N-hydroxy-5-norbornene-2,3-dicarboximide are preferred. These compounds are used alone, or two or more kinds of them are used in combination.

The proportion of the component represented by the general formula (7) (—N—$(R^{11})_m$—X components of the general formulas (2) and (3)) to be introduced is preferably within a range from 0.1 to 60 mol %, and particularly preferable from 5 to 50 mol %, in terms of the primary monoamine component as the end capping agent which is the original component, based on the entire acid dianhydride component.

The proportion of the components represented by the general formulas (8) and (9) (—CO—$(R^{11})_m$—Y component of the general formulas (4) and (5)) to be introduced is preferably within a range from 0.1 to 60 mol %, and particularly preferable from 5 to 55 mol %, in terms of the compound component selected from an acid anhydride, a monocarboxylic acid, a monoacid chloride compound and a mono-active ester compound as the end capping agent which is the original component, based on the diamine component.

Furthermore, $R^8$ or $R^9$ may be copolymerized with an aliphatic group having a siloxane structure so as to improve adhesion with the substrate as long as the heat resistance does not deteriorate. Specifically, those obtained by copolymerizing with 1 to 10 mol % of the diamine component such as bis(3-aminopropyl)tetramethyldisiloxane or bis(p-aminophenyl)octamethylpentasiloxane are included.

Also, the structures of the general formulas (2) to (5) preferably include a fluorine atom because water repellency is imparted to the interface of the film in the case of developing with an aqueous alkaline solution, and thus penetration of the solution into the interface is suppressed. The content of the fluorine atom based on the polyimides represented by the general formulas (2) to (5) is preferably 10% by weight so as to obtain a sufficient effect of preventing penetration into the interface, and is preferably 20% by weight or less in view of solubility in the aqueous alkaline solution.

The polyimide as the component (a) used in the photosensitive resin composition of the present invention may be composed only of structural units represented by the general formulas (2) to (5), or may be a copolymer or a mixture with other structural units. In that case, it is preferred to contain the structural units represented by the general formulas (2) to (5) in the proportion of 10% by weight or more based on the entire polyimide. Ensuring that the proportion is 10% by weight or more enables suppression of shrinkage upon thermal curing, and is suited for formation of a thick film. The kind and the amount of the structural unit used in copolymerization or mixing are preferably selected so as not to deteriorate heat resistance of the polyimide obtained by a final heat treatment.

The polyimide as the component (a) can be synthesized by substituting a portion of the diamine with a monoamine which is an end capping agent, or substituting an acid dianhydride with a compound selected from end capping agents such as a monocarboxylic acid, an acid anhydride, a monoacid chloride compound and a mono-active ester compound using a known method. For example, a polyimide precursor is obtained by employing a method in which a tetracarboxylic dianhydride, a diamine compound and a monoamine are reacted at low temperature, a method in which a tetracarboxylic dianhydride, an acid anhydride, a monoacid chloride compound or mono-active ester compound, and a diamine compound are reacted at low temperature, a method in which a diester is obtained from a tetracarboxylic dianhydride and an alcohol and then a diamine is reacted with a monoamine in the presence of a condensing agent, a method in which a diester is obtained from a tetracarboxylic dianhydride and an alcohol and the residual dicarboxylic acid is subjected to acid chlorination and, followed by substitution with a diamine or a monoamine, a method in which the resulting polyimide precursor is completely imidized using a known imidation reaction method, a method in which an imidation reaction is terminated on the way and an imide structure is partially introduced, or a method in which an imide structure is partially introduced by mixing a completely imidized polymer with the above polyimide precursor.

Also, the imidation ratio of the polyimide as the component (a) can be easily obtained, for example, by the following method. As used herein, the imidation ratio means how many mol % of a polyimide precursor is converted into a polyimide in the case of synthesizing a polyimide via the polyimide precursor as described above. First, an infrared absorption spectrum of a polymer is measured and the presence of absorption peaks (about 1,780 cm$^{-1}$, about 1,377 cm$^{-1}$) of an imide structure, assigned to a polyimide, is confirmed. After the polymer is subjected to a heat treatment at 350° C. for one hour, an infrared absorption spectrum is measured and a peak strength at about 1,377 cm$^{-1}$ before the heat treatment is compared with that after the heat treatment. Assuming that the imidation ratio of the polymer after the heat treatment is 100%, the imidation ratio of the polymer before the heat treatment is determined.

The end capping agent introduced into the polyimide as the component (a) can be easily detected by the following method. For example, the polyimide containing an end capping agent introduced thereinto is dissolved in an acidic solution, thereby decomposing into an amine component and an acid anhydride component as constituent units of the polyimide, and then the measurement is conducted using gas chromatography (GC) and NMR. Separately, the end capping agent can be easily detected by directly measuring the polyimide containing an end capping agent introduced thereinto using pyrolysis gas chromatography (PGC), or infrared spectrum and $^{13}$CNMR spectrum.

The photosensitive resin composition of the present invention contains a polymerizable compound (b1) represented by the general formula (1).

[Chemical Formula 9]

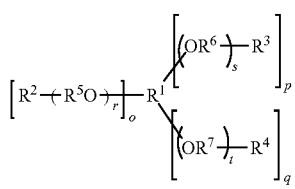

(1)

In the general formula (1), $R^1$ represents a mono- to trivalent organic group having at least one aromatic ring. The strength of the cured film is improved by including of an aromatic ring in the polymerizable compound. Specific examples of $R^1$ include structures shown below:

[Chemical Formula 10]

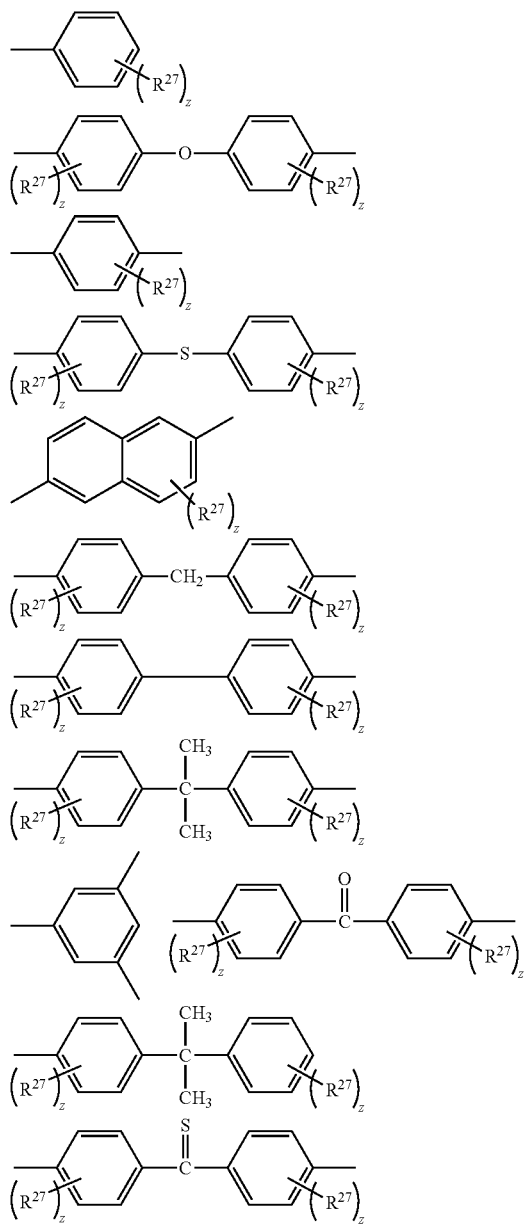

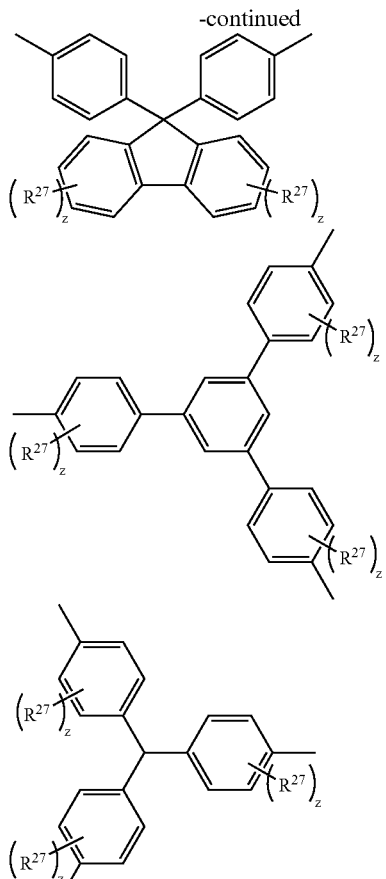

wherein $R^{27}$ each independently represents a methyl group, an ethyl group, a propyl group, a t-butyl group or a hydroxyl group, and z each independently represents an integer from 0 to 2.

Of these structures, a structure having a bisphenol skeleton is particularly preferred.

In the general formula (1), $R^2$ to $R^4$ represent a polymerizable group having an unsaturated bond, and o, p and q represent an integer from 0 to 1, provided that $o+p+q \geq 1$. Examples of $R^2$ to $R^4$ include unsaturated double bond-containing groups such as a vinyl group, an allyl group, an acryloyl group, and a methacryloyl group; and unsaturated triple bond-containing groups such as propargyl. Of these groups, a conjugated vinyl group, an acryloyl group and a methacryloyl group are preferred in view of polymerizability.

Also, $R^5$ to $R^7$ represent a di-valent organic group. Since the polymerizable compound has a repeated structure of $OR^i$ (i=5 to 7) in the molecule, the postcured and cured films do not lose flexibility and elongation of the cured film is improved. The repeating number (r, s and t) is from 1 to 10. When the repeating number is more than 10, it becomes impossible to satisfactorily form a pattern and also the strength of the film decreases.

$R^5$ to $R^7$ preferably represent a hydrocarbon group. Examples of preferred hydrocarbon group include a methylene group, an ethylene group, a propylene group, an isopropylene group, a butylene group, an isobutylene group, a neopentylene group, and those in which these groups are substituted with a hydroxyl group. Also, $R^5$ to $R^7$ may be the same or different, or may be the same or different every repeating unit.

Particularly preferred examples of the compound (b1) in the photosensitive resin composition of the present invention are shown below.

[Chemical Formula 11]

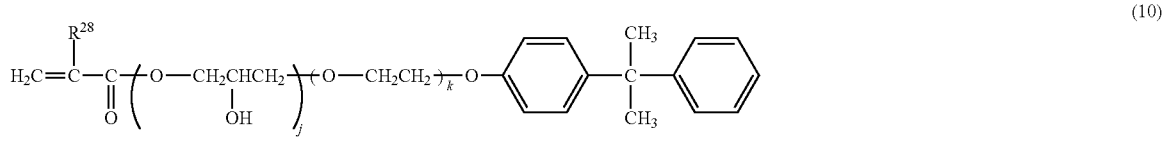
(10)

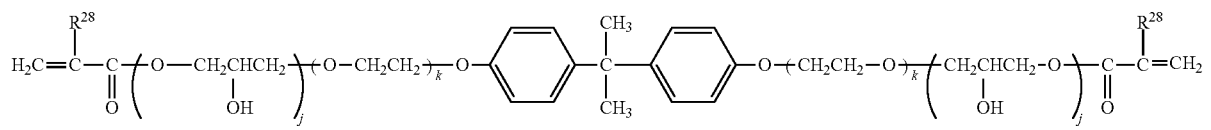
(11)

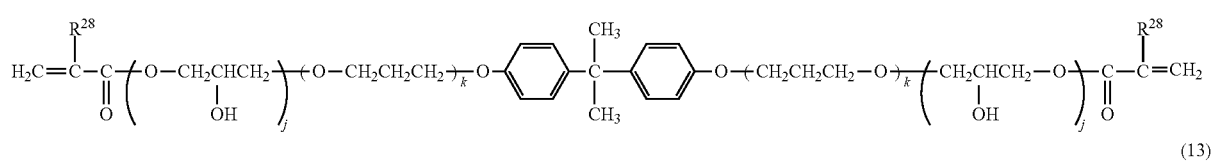
(12)

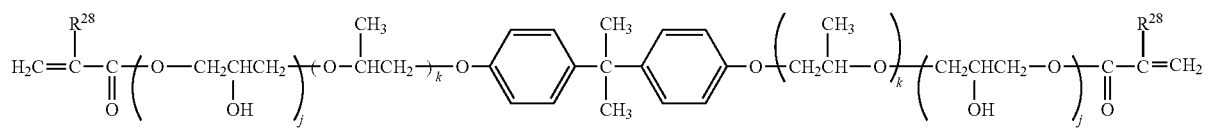
(13)

In the formulas (10) to (13), $R^{28}$ represents a hydrogen atom or a methyl group, j represents 0 or 1, and k represents an integer from 0 to 10, provided that $1 \leq j+k \leq 10$.

The content of the unsaturated bond-containing polymerizable compound (b1) in the photosensitive resin composition of the present invention is preferably from 5 to 200 parts by weight based on 100 parts by weight of the polyimide (a), and more preferably from 5 to 150 parts by weight in view of compatibility. Ensuring that the content is controlled to 5 parts by weight or more enables prevention of dissolution of the exposed area of the film upon development, and a sufficient residual film after the development. Also, ensuring that the content is controlled to 200 parts by weight or less enables formation of a sufficient residual film while suppressing whitening of the film upon formation of the film.

Preferably, the photosensitive resin composition of the present invention further contains an unsaturated bond-containing polymerizable compound (b2) having an alicyclic hydrocarbon group. When the polymerizable compound having an alicyclic hydrocarbon group is used, developability is improved by hydrophobicity of the alicyclic hydrocarbon group, and thus making it possible to obtain a minute pattern with high resolution. Examples of a functional group having an unsaturated bond include functional groups having an unsaturated double bond, such as a vinyl group, an allyl group, an acryloyl group, and a methacryloyl group; and functional groups having an unsaturated triple bond, such as propargyl. Of these functional groups, a conjugated vinyl group, an acryloyl group and a methacryloyl group are preferable in view of polymerizability.

Examples of the alicyclic hydrocarbon group include groups including a cyclohexane structure, a dicyclopentadiene structure, and a tricyclodecane structure. Preferred examples of the compound (b2) include cyclohexyl vinyl ether, cyclohexanedimethanol divinyl ether, cyclohexyl acrylate, cyclohexyl methacrylate, dicyclopentenyl acrylate, dicyclopentenyl methacrylate, dicyclopentenyloxyethyl acrylate, dicyclopentenyloxyethyl methacrylate, tricyclodecanyl acrylate, tricyclodecanyl methacrylate, dimethylol-tricyclodecane diacrylate, dimethylol-tricyclodecane dimethacrylate, isobornyl acrylate, and isobornyl methacrylate. Of these compounds, tricyclodecanyl acrylate, tricyclodecanyl dimethacrylate, dimethylol-tricyclodecane diacrylate, dimethylol-tricyclodecane dimethacrylate, isobornyl acrylate and isobornyl methacrylate are preferred.

It is also possible to add, in addition to the compound (b1) and the compound (b2), another polymerizable compound (b3). Specific examples of the compound include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol methacrylate, 1,9-nonanediol dimethacrylate, 1,10-decanediol dimethacrylate, pentaerythritol triacrylate, pentaerythritol tetraacrylate, pentaerythritol trimethacrylate, pentaerythritol tetramethacrylate, 2-hydroxyethylacrylate, 2-hydroxyethyl methacrylate, 1,3-acryloyloxy-2-hydroxypropane, 1,3-methacryloyloxy-2-hydroxypropane, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6- tetramethylpiperidinyl acrylate, N-vinyl pyrrolidone, and N-vinylcaprolactam. These compounds can be used alone, or two or more kinds of them can be used in combination. In the case of using the compound (b3), it can be used in combination with only the compound (b1), or can be used in combination with both of the compound (b1) and the compound (b2).

The total content of the compound (b1) and the compound (b2) in the photosensitive resin composition of the present invention is preferably from 5 to 200 parts by weight based on 100 parts by weight of the polyimide (a), and more preferably from 5 to 150 parts by weight in view of compatibility. Ensuring that the content is controlled to parts by weight or more enables prevention of dissolution of the exposed area of the film upon development, and a sufficient residual film after the development. Also, ensuring that the content is controlled to 200 parts by weight or less enables formation of a sufficient residual film while suppressing whitening of the film upon formation of the film.

In the case of using the compound (b1) in combination with the compound (b2), the weight ratio the compound (b1)/the compound (b2) is preferably from 90/10 to 30/70. Ensuring that the weight ratio is controlled within the above range enables preparation of a photosensitive resin composition which has excellent developability, strength of the film and elongation of the film.

In the case of containing, in addition to the compound (b1) and the compound (b2), the compound (b3), the total content of all of these compounds is preferably from 5 to 200 parts by weight based on 100 parts by weight of the polyimide (a), and more preferably from 5 to 150 parts by weight in view of compatibility. The content of the compound (b3) is preferably 30 parts by weight or less based on 100 parts by weight of the total content of the compound (b1) and the compound (b2) in view of developability, strength of the film and elongation of the film.

Examples of the photopolymerization initiator (c) contained in the photosensitive resin composition of the present invention include benzophenones such as benzophenone, Michlers ketone, 4,4,-bis(diethylamino)benzophenone, and 3,3,4,4,-tetra(t-butylperoxycarbonyl)benzophenone; benzylidenes such as 3,5-bis(diethylaminobenzylidene)-N-methyl-4-piperidone and 3,5-bis(diethylaminobenzylidene)-N-ethyl-4-piperidone; coumarins such as 7-diethylamino-3-nonylcoumarin, 4,6-dimethyl-3-ethylaminocoumarin, 3,3-carbonylbis(7-diethylaminocoumarin), 7-diethylamino-3-(1-methylmethylbenzoimidazolyl)coumarin, and 3-(2-benzothiazolyl)-7-diethylaminocoumarin; anthraquinones such as 2-t-butylanthraquinone, 2-ethylanthraquinone, and 1,2-benzanthraquinone; benzoins such as benzoin methyl ether, benzoin ethyl ether, and benzoin isopropyl ether; thioxanthones such as 2,4-dimethylthioxanthone, 2,4-diethylthioxanthone, 2,4-diisopropylthioxanthone, and 2-isopropylthioxanthone; mercaptos such as ethylene glycol di(3-mercaptopropionate) 2-mercaptobenzthiazole, 2-mercaptobenzooxazole, and 2-mercaptobenzimidazole; glycines such as N-phenylglycine, N-methyl-N-phenylglycine, N-ethyl-N-(p-chlorophenyl)glycine, and N-(4-cyanophenyl)glycine; oximes such as 1-phenyl-1,2-butanedion-2-(o-methoxycarbonyl)oxime, 1-phenyl-1,2-propanedion-2-(o-methoxycarbonyl)oxime, 1-phenyl-1,2-propanedion-2-(o-ethoxycarbonyl)oxime, 1-phenyl-1,2-propanedion-2-(o-benzoyl)oxime, bis(α-isonitrosopropiophenone oxime)isophthal, and 1,2-octandione-1-[4-(phenylthio)phenyl]-2-(o-benzoyloxime); α-aminoalkylphenones such as 2-benzyl-2-dimethylamino-1-(4-morpholinophenyl)-butan-1-one and 2-methyl-1[4-(methylthio)phenyl]-2-morpholinopropan-1-one; and 2,2'-bis(o-chlorophenyl)-4,4',5,5'-tetraphenylbiimidazole. Of these photopolymerization initiators, combinations of compounds selected from benzophenones, glycines, mercaptos, oximes, α-aminoalkylphenones and 2,2'-bis(o-chlorophenyl)-4,4',5,5'-tetraphenylbiimidazole are preferred in view of the photoreaction. These photopolymerization initiators are used alone, or two or more kinds of them are used in combination. Oximes are more preferred and compounds selected from 1-phenyl-1,2-propanedion-2-(o-ethoxycarbonyl)oxime, 1-phenyl-1,2-propanedion-2-(o-benzoyl)oxime, bis(α-isonitrosopropiophenone oxime)isophthal and 1,2-octandione-1-[4-(phenylthio)phenyl]-2-(o-benzoyloxime) are more preferred.

The content of the photopolymerization initiator (c) is preferably from 0.1 to 40 parts by weight based on 100 parts by weight of the polyimide (a) in the case of using these photopolymerization initiators alone, and the total content is preferably from 0.2 to 60 parts by weight in the case of using two or more kinds of them in combination.

Preferably, the photosensitive resin composition of the present invention further contains a thermocrosslinkable compound (d). Since the thermocrosslinking reaction occurs upon a heat treatment by the inclusion of the thermocrosslinkable compound (d), the shrinkage ratio can decrease. Examples of the thermocrosslinkable compound (d) include a compound having a thermocrosslinkable group represented by the general formula (6), and a benzooxazine compound:
[Chemical Formula 12]

(6)

wherein $R^{13}$ represents a hydrogen atom, an alkyl group having 1 to 20 carbon atoms, an alicyclic hydrocarbon group having 4 to 20 carbon atoms, or an $R^{14}CO$ group, and $R^{14}$ represents an alkyl group having 1 to 20 carbon atoms.

The compound having a thermocrosslinkable group is preferably a compound having at least two thermocrosslinkable groups. Particularly preferred examples thereof include compounds having two thermocrosslinkable groups, such as 46DMOC, 46DMOEP (trade names, manufactured by Asahi Organic Chemicals Industries Co., Ltd.), DML-MBPC, DML-MBOC, DML-OCHP, DML-PC, DML-PCHP, DML-PTBP, DML-34X, DML-EP, DML-POP, dimethylol-BisOC-P, DML-PFP, DML-PSBP, DML-MTrisPC, DMOM-PTBP (trade names, manufactured by Honshu Chemical Industry Co., Ltd.), NIKALAC MX-290 (trade name, manufactured by Sanwa Chemical Co., Ltd.), B-a type benzooxazine, B-m type benzooxazine (trade names, manufactured by Shikoku Chemicals Corporation), 2,6-dimethoxymethyl-4-t-butylphenol, 2,6-dimethoxymethyl-p-cresol, and 2,6-diacetoxymethyl-p-cresol; compounds having three thermocrosslinkable groups, such as TriML-P and TriML-35XL (trade names, manufactured by Honshu Chemical Industry Co., Ltd.); compounds having four thermocrosslinkable groups, such as TM-BIP-A (trade name, manufactured by Asahi Organic Chemicals Industries Co., Ltd.), TML-BP, TML-HQ, TML-pp-BPF, TML-BPA, TMOM-BP (trade names, manufactured by Honshu Chemical Industry Co., Ltd.), NIKALAC MX-280, NIKALAC MX-270(trade names, manufactured by Sanwa Chemical Co., Ltd.); and compounds having six thermocrosslinkable groups, such as HML-TPPHBA, HML-TPHAP, HMOM-TPPHBA, and HMOM-TPHAP (trade names, manufactured by Honshu Chemical Industry Co., Ltd.). More preferred examples include alicyclic compounds NIKALAC MX-280 and NIKALAC MX-270 (trade names, manufactured by Sanwa Chemical Co., Ltd.), and B-a type benzooxazine and B-m type benzooxazine (trade names, manufactured by Shikoku Chemicals Corporation); and compounds having three thermocrosslinkable groups, such as NIKALAC MW-390 and NIKALAC MW-100LM (trade names, manufactured by Sanwa Chemical Co., Ltd.).

Structures of typical thermocrosslinkable compounds, which are particularly preferably used in the present invention, are shown below.

[Chemical Formula 13]

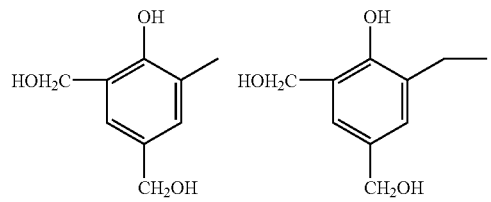
46DMOEP

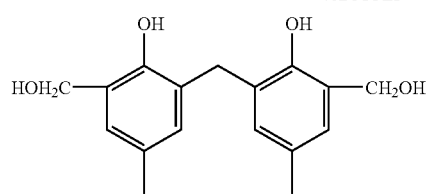
DML-MBPC

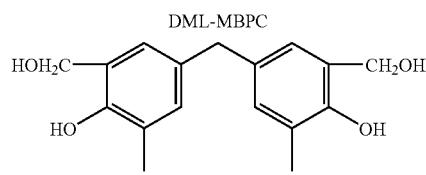
DML-MBOC

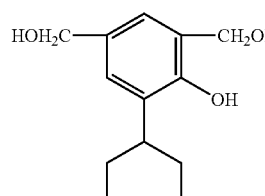
DML-OCHP

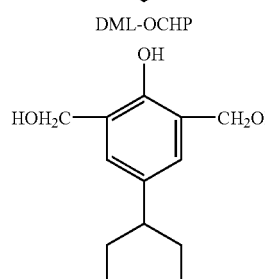
DML-PCHP

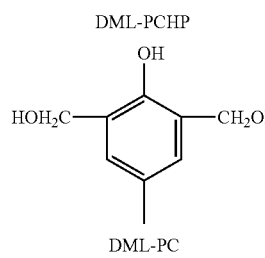
DML-PC

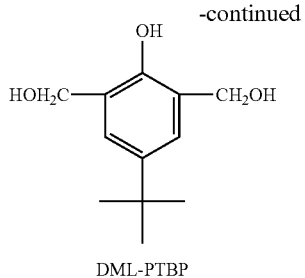
DML-PTBP

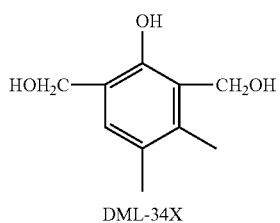
DML-34X

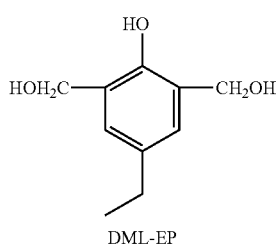
DML-EP

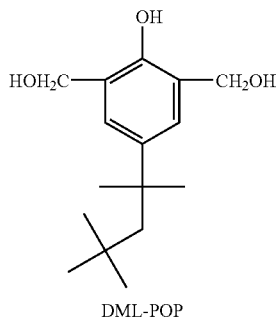
DML-POP

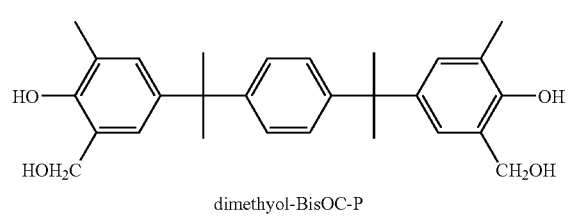
dimethyol-BisOC-P

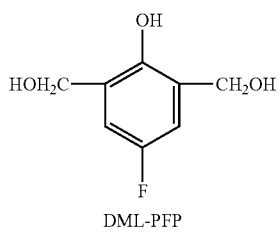
DML-PFP

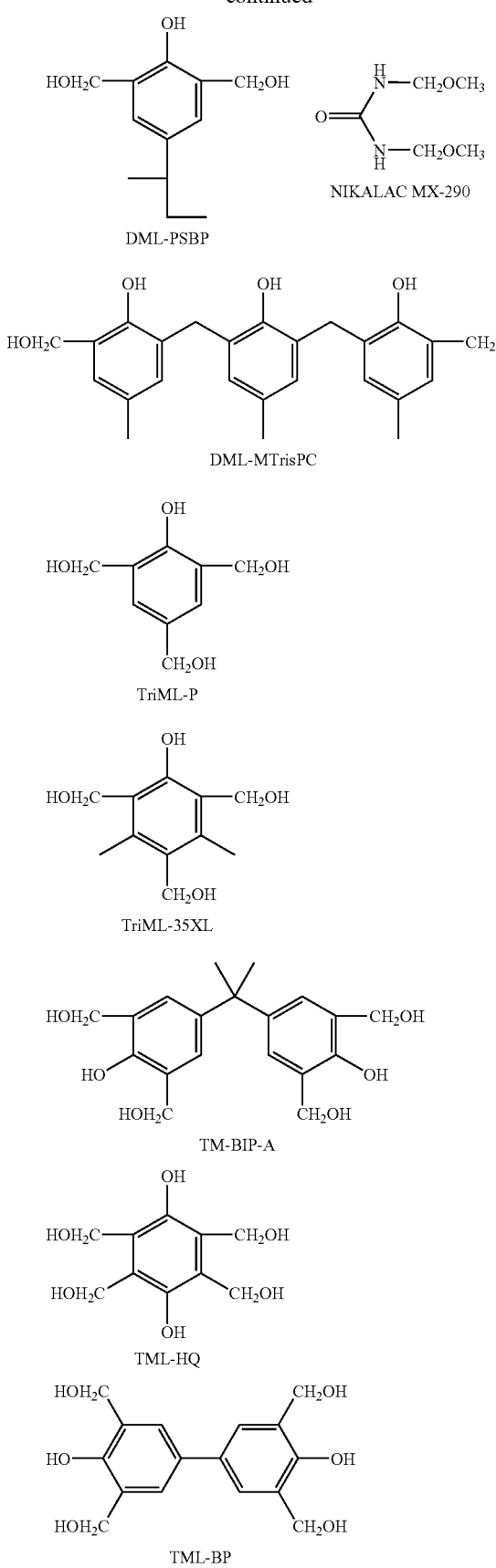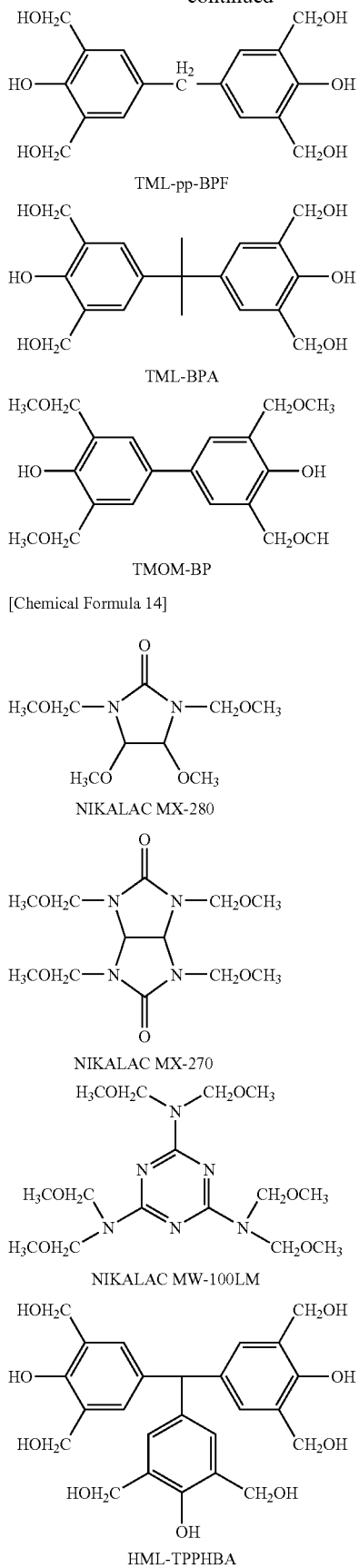

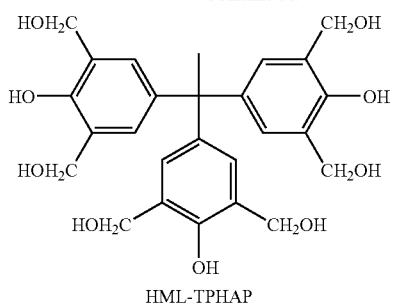

HML-TPHAP

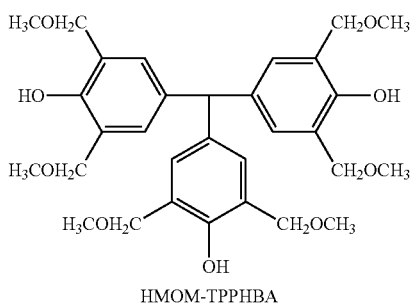

HMOM-TPPHBA

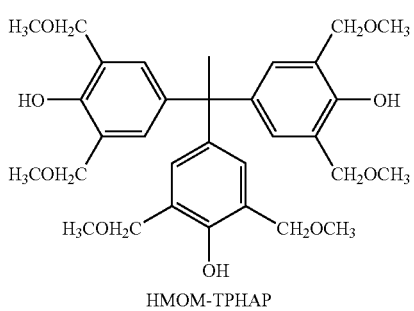

HMOM-TPHAP

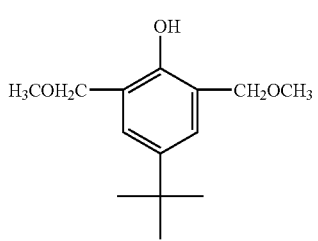

2,6-dimethoxymethyl-4-t-butylphenol

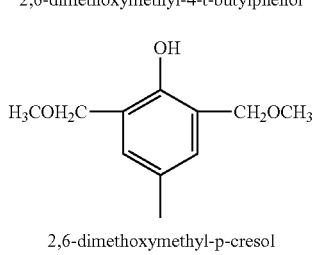

2,6-dimethoxymethyl-p-cresol

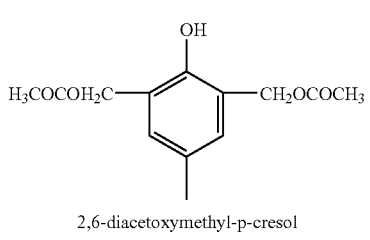

2,6-diacetoxymethyl-p-cresol

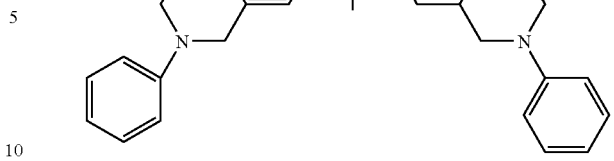

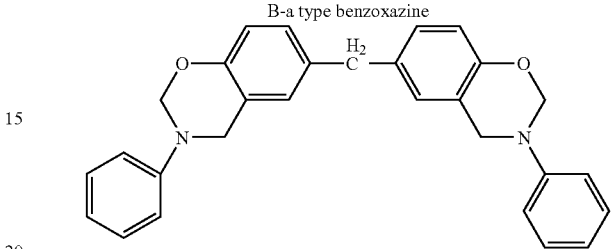

B-a type benzoxazine

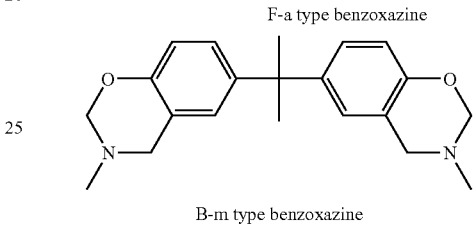

F-a type benzoxazine

B-m type benzoxazine

Of these thermocrosslinkable compounds (d), for example, a compound having a methylol group is crosslinked by a reaction mechanism of directly adding to the benzene ring, as shown below.

[Chemical Formula 15]

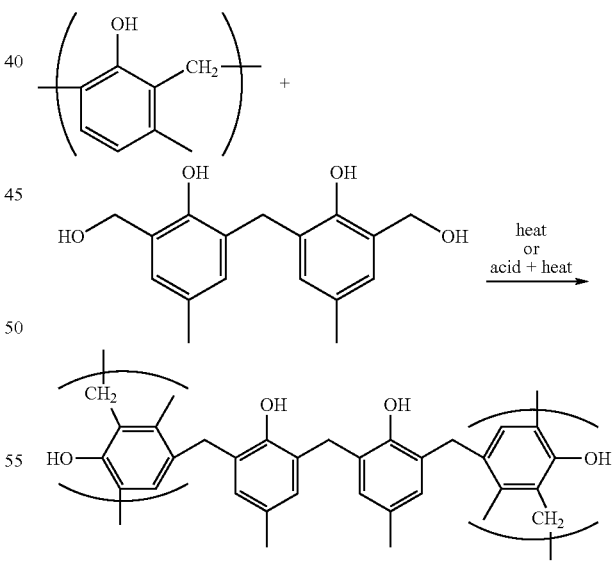

The content of the thermocrosslinkable compound is preferably within a range from 0.5 to 150 parts by weight, and more preferably from 1 to 130 parts by weight, based on 100 parts by weight of the polyimide as the component (a). Ensuring that the content of the thermocrosslinkable compound (d) based on 100 parts by weight of the component (a) is controlled to 150 parts by weight or less enables prevention of deterioration of heat resistance of a heat resistant resin composition film, whereas ensuring that the content of the thermocrosslinkable compound is controlled to 0.5 parts by weight or more enables an improvement in heat resistance of a heat resistant resin composition film through the effect of increasing a molecular weight exerted by sufficient crosslinking.

Also, the photosensitive resin composition of the present invention can further contain a coloring agent (e) Inclusion of the coloring agent exerts the effect of preventing stray light from areas of light emission when used in an insulating layer of an organic electroluminescence element and exerts the effect of blinding a circuit wiring on a substrate when used in solder resist for circuit board.

Examples of the coloring agent used in the present invention include dyes, thermochromatic dyes, inorganic pigments, and organic pigments. The coloring agent is preferably a coloring agent which is soluble in an organic solvent capable of dissolving in the component (a), and is also compatible with the component (a).

Of these coloring agents, the dye includes, for example, oil-soluble dyes, disperse dyes, reactive dyes, acid dyes, and direct dyes. As the skeleton structure of the dye, for example, anthraquinone-based, azo-based, phthalocyanine-based, methine-based and oxazine-based skeleton structures, and metal-containing complex salt-based skeleton structures of these dyes can be used. Of these skeleton structures, phthalocyanine-based and metal-containing complex salt-based skeleton structures are more preferred because of excellent heat resistance and light resistance. Specific examples thereof include Sumilan and Lanyl dyes (manufactured by Sumitomo Chemical Co., Ltd.); Orasol, Oracet, Filamid and Irgasperse dyes (manufactured by Ciba Specialty Chemicals Inc.); Zapon, Neozapon, Neptune and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren and Lanasyn dyes (manufactured by Clariant Japan Co., Ltd.); and Aizen Spilon dye (manufactured by Hodogaya Chemical Co., Ltd.). These dyes can be used alone or in combination.

The thermochromatic dye includes a thermochromatic compound which develops a color upon heating and shows an absorption maximum at a wavelength of 350 nm or more and 700 nm or less. The thermochromatic compound includes a thermochromatic compound which develops a color by changing the chemical structure or charge state through an action of an acidic group coexisting in the system upon heating, or a thermochromatic compound which develops a color as a result of the occurrence of a thermal oxidation reaction through the presence of oxygen in the air. Examples of the skeleton structure of the thermochromatic dye include a triarylmethane skeleton, a diarylmethane skeleton, a fluorane skeleton, bislactone skeleton, a phthalide skeleton, a xanthene skeleton, a rhodaminelactam skeleton, a fluorene skeleton, a phenothiazine skeleton, a phenoxazine skeleton, and a spiropyran skeleton. For example, the thermochromatic dyes are preferably hydroxyl group-containing compounds having a triarylmethane skeleton, such as 2,4',4"-methylidenetrisphenol, 4,4',4"-methylidenetrisphenol, 4,4'-[(4-hydroxyphenyl)methylene]bis(benzenamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4'''-(1,2-ethanediylidene)tetrakisphenol, 4,4',4",4'''-(1,2-ethanediylidene)tetrakis[2-methylphenol], 4,4',4",4'''-(1,2-ethanediylidene)tetrakis[2,6-dimethylphenol], 4,4',4",4'''-(1,4-phenylenedimethylidene)tetrakisphenol, 4,4',4",4'''-(1,4-phenylenedimethylidene)tetrakis(2,6-dimethylphenol), 4,4'-[(2-hydroxyphenyl)methylene]bis[3-methylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 4,4'-[(2-hydroxyphenyl)methylene]bis[2-methylethylphenol], 4,4'-[(4-hydroxyphenyl)methylene]bis[2-methylethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'-[(2-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4'-hydroxy-6-methylphenyl)]methyl]phenol, and 4,4'-(3,5-dimethyl-4-hydroxyphenylmethylene)-bis(2,6-dimethylphenol) because of excellent heat resistance. These compounds are used alone or in combination.

The thermochromatic dye is preferably a compound which develops a color at a temperature higher than 120° C., and more preferably a thermochromatic compound which develops a color at a temperature higher than 180° C. The thermochromatic compound having a higher color developing temperature has excellent heat resistance under high temperature conditions, and is also less likely to cause color degradation as a result of irradiation with ultraviolet-visible light for a long time and has excellent light resistance.

The organic pigment is preferably a pigment which has high color developability and also has high heat resistance. Particularly, combinations of two or more kinds of organic pigments selected from among carbon black and other organic pigments are preferred. Examples of the carbon black include furnace blacks such as HCF, MCF, LFF, RCF, SAF, ISAF, HAF, XCF, FEF, GPF, and SRF; thermal blacks such as FT and MT; channel blacks; and acetylene blacks. These carbon blacks can be used alone, or two or more kinds of them can be used in combination.

Other organic pigments are preferably those which have excellent heat resistance. Specific examples of typical pigments are indicated by color index (CI) No. Examples of yellow pigments include Pigment Yellow 12, 13, 14, 17, 20, 24, 31, 55, 83, 86, 93, 94, 109, 110, 117, 125, 137, 138, 139, 147, 148, 150, 153, 154, 155, 166, 168, 173,180, and 185. Examples of orange pigments include Pigment Orange 13, 31, 36, 38, 40, 42, 43, 51, 55, 59, 61, 64, 65, and 71. Examples of red pigments include Pigment Red 9, 97, 122, 123, 144, 149, 166, 168, 176, 177, 180, 190, 192, 209, 215, 216, 224, 242, and 254. Examples of violet pigments include Pigment Violet 19, 23, 29, 32, 33, 36, 37, and 38. Examples of blue pigments include Pigment Blue 15 (15:3, 15:4, 15:6, etc.), 21, 22, 60, and 64. Examples of green pigments include Pigment Green 7, 10, 36, and 47.

The inorganic pigment is preferably an insulating metal compound. The use of an inorganic pigment having excellent electrical insulation properties enables sufficient function as an insulating layer of an organic electroluminescence display device, and thus a light emitting element can be produced without causing electrical short circuiting. Examples of the insulating metal compound include manganese oxide, titanium oxide, titanium oxynitride, chromium oxide, vanadium oxide, iron oxide, cobalt oxide, and niobium oxide. Particularly, manganese oxide and titanium oxynitride are preferably used in the present invention. Manganese oxide commonly has the composition of $Mn_xO_y$ ($0<x<y \leq 2x$). Specific examples thereof include $\gamma$-$MnO_2$, $\beta$-$MnO_2$, $\alpha$-$MnO_2$, $Mn_2O_3$, and $Mn_3O_4$, and amorphous $Mn_xO_y$ ($0<x<y \leq 2x$) is also used. The primary particle size of a manganese oxide powder is preferably 100 nm or less, and more preferably 60 nm or less. The primary particle size can be determined by an arithmetic means using an electron microscope.

Titanium oxynitride commonly has the composition of $TiN_\alpha O_\beta$ ($0<\alpha<2$, $0.1<\beta<2$). The primary particle size of titanium oxynitride is preferably 100 nm or less, and more preferably 60 nm or less, similar to manganese oxide.

The content of the coloring agent (e) used in the present invention is preferably from 0.2 to 100 parts by weight, and particularly preferably from 0.4 to 70 parts by weight, based on 100 parts by weight of the polyimide (a). Ensuring that the content of the coloring agent (e) is controlled within a range from 0.2 to 100 parts by weight based on 100 parts by weight of the component (a) enables achievement of a function as a blinding agent while maintaining adhesion between a photosensitive resin film and a substrate.

In the present invention, the organic pigment and the inorganic pigment to be used may be subjected to surface treatments such as a rosin treatment, an acidic group treatment, and a basic group treatment, if necessary. Examples of the dispersing agent include surfactants such as cationic, anionic, nonionic, amphoteric, silicone-based, and fluorine-based compounds.

It is sometimes preferred that the coloring agent as the component (e) used in the present invention shows a wide absorption from the infrared to ultraviolet range according to purpose so as to exhibit a function as a solder resist, and a light shielding separator, a black matrix and a blinding agent of an organic electroluminescence display device and a liquid crystal display device. Examples of a coloring method include a method in which one or more kinds of dyes or pigments are used, a method in which two or more kinds of dyes or pigments are used, and a method in which one or more kinds of dyes or pigments are used in combination with other dyes or pigments.

For the purpose of controlling alkaline developability of the composition, it is possible to contain a compound having a phenolic hydroxyl group.

Examples of the compound having a phenolic hydroxyl group, which can be used in the present invention, include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakisP-DO-BPA), TrisP-HAP, TrisP-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, and BisRS-OCHP (all of which are manufactured by Honshu Chemical Industry Co., Ltd. under the above trade names); and BIR-OC, BIP-PC, BIR-PC, BIR-PTBP, BIR-PCHP, BIP-BIOC-F, 4PC, BIR-BIPC-F, and TEP-BIP-A (all of which are manufactured by Asahi Organic Chemicals Industries Co., Ltd. under the above trade names).

Of these compounds, preferable compounds having a phenolic hydroxyl group include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-26X, BisRS-3P, BisP-OCHP, methylenetris-FR-CR, BisRS-26X, BIP-PC, BIR-PC, BIR-PTBP, and BIR-BIPC-F. Of these compounds, particularly preferable compounds having a phenolic hydroxyl group include Bis-Z, TekP-4HBPA, TrisP-HAP, TrisP-PA, BisRS-2P, BisRS-3P, BIR-PC, BIR-PTBP, and BIR-BIPC-F. A resin composition obtained by adding the compound having a phenolic hydroxyl group is easily soluble in an alkaline developing solution before the exposure, and becomes slightly soluble in an alkaline developing solution after the exposure. Therefore, the development can be conducted within a short time without producing much thickness loss.

The content of the compound having a phenolic hydroxyl group is preferably within a range from 1 to 60 parts by weight, and more preferably from 3 to 50 parts by weight based on 100 parts by weight of the polyimide (a).

For the purpose of improving wettability between a photosensitive resin composition and a substrate, it is possible to mix with surfactants, esters such as ethyl lactate and propylene glycol monomethyl ether acetate, alcohols such as ethanol, ketones such as cyclohexanone and methyl isobutyl ketone, and ethers such as tetrahydrofuran and dioxane according to purpose, if necessary. It is also possible to add inorganic particles such as silicon dioxide and titanium dioxide, a polyimide powder.

To enhance adhesion with a base substrate such as a silicone wafer, 0.5 to 10% by weight of silane coupling agents and titanium chelating agents can be added to a varnish as a photosensitive resin composition, and also the base substrate can be pretreated with the agents.

In the case of adding these components to the varnish, silane coupling agent such as methylmethacryloxydimethoxysilane and 3-aminopropyltrimethoxysilane, titanium chelating agents, and aluminum chelating agents are preferably added in an amount of 0.5 to 10 parts by weight based on 100 parts by weight of the polyimide (a) in the varnish.

In the case of treating the substrate with these components, the substrate is surface-treated by spin coating, dipping, spray coating, steam treatment using a solution prepared by dissolving the above coupling agent in a solvent such as isopropanol, ethanol, methanol, water, tetrahydrofuran, propyleneglycol monomethyl ether acetate, propylene glycol monomethyl ether, ethyl lactate, or diethyl adipate in a concentration of 0.5 to 20% by weight. In some cases, the reaction between the substrate and the coupling agent can be allowed to process by heating to a temperature within a range from 50 to 300° C.

The components (a) to (e) and the compound having a phenolic hydroxyl group in the present invention are used in the state of being dissolved and/or dispersed in an organic solvent. The organic solvent used herein preferably has a boiling point of 80 to 250° C. under an atmospheric pressure.

Specific examples of the organic solvent include ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether, and ethylene glycol dibutyl ether; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetylacetone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; aromatic hydrocarbons such as toluene and xylene; and N-methyl-2-pyrrolidone, N-cyclohexyl-2-pyrrolidone, N,N-dimethylformamide, N,N-dimethylacetamide, dimethyl sulfoxide, and γ-butyrolactone. Of these organic solvents, an organic solvent which dissolves the component (a) and has a boiling point of 100 to 180° C. under an atmospheric pressure is particularly preferred. When the boiling point is within the above range, there is not a problem that it becomes impossible to apply the solution because of excessive vaporization of the solvent, and it is not necessary to increase the heat treatment temperature of the composition. Therefore, there are no restrictions on the material of the base substrate. Also, a film having favorable uniformity can be formed on the base substrate by using a solvent which dissolves the component (a).

Specific examples of particularly preferable organic solvents having such a boiling point include cyclopentanone, ethylene glycol monomethyl ether, ethylene glycol monoethyl ether, propylene glycol monomethyl ether, methyl lactate, ethyl lactate, diacetone alcohol, and 3-methyl-3-methoxybutanol.

The amount of the organic solvent used in the resin composition of the present invention is preferably from 20 to 800 parts by weight, and particularly preferably from 30 to 500 parts by weight, based on 100 parts by weight of the polymer as the component (a). These organic solvents can be used alone or in combination.

A method for forming a pattern of a heat resistant resin film using the photosensitive resin composition of the present invention will now be described.

First, the photosensitive resin composition is applied on a substrate. As the substrate, a silicone wafer, ceramics and gallium arsenide are used, but the substrate is not limited thereto. Examples of a coating method include a rotary coating using a spinner, a spray coating, and a roll coating method. Although the film thickness varies depending on the coating method, and the solid content and viscosity of the resin composition, the photosensitive resin composition is commonly applied such that the film thickness after drying is from 1 to 150 μm.

Next, the substrate on which the photosensitive resin composition was applied is dried to obtain a photosensitive resin composition film. The drying operation is preferably conducted at a temperature within a range from 50 to 150° C. for one minute to several hours using an oven, a hot plate, or infrared ray.

Next, the photosensitive resin composition film is exposed by irradiation with chemical ray through a mask having a desired pattern. Examples of the chemical rays used in the exposure include ultraviolet rays, visible rays, an electron beam, and X-rays. In the present invention, i-rays (365 nm), h-rays (405 nm) and g-rays (436 nm) from a mercury lamp are preferably used.

After the exposure, the unexposed area is removed with a developing solution to form a pattern.

Examples of the developing solution include N-methyl-2-pyrrolidone, N-acetyl-2-pyrrolidone, N,N-dimethylformamide, N,N-dimethylacetamide, dimethyl sulfoxide, and hexamethylphosphortriamide alone; organic solvents such as methanol, ethanol, isopropyl alcohol, methyl carbitol, ethyl carbitol, toluene, xylene, ethyl lactate, ethyl pyruvate, propylene glycol monomethyl ether acetate, methyl-3-methoxypropionate, ethyl-3-ethoxypropionate, 2-heptanone, and ethyl acetate; an aqueous solution of tetramethylammonium; and aqueous solutions of compounds having alkalinity such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. Particularly, an aqueous solution of tetramethylammonium, and aqueous solutions of compounds having alkalinity such as diethanolamine, diethylaminoethanol, sodium hydroxide, potassium hydroxide, sodium carbonate, potassium carbonate, and triethylamine are preferred. In some cases, to these aqueous alkaline solutions, polar solvents such as N-methyl-2-pyrrolidone, N,N-dimethylformamide, N,N-dimethyl acetamide, dimethyl sulfoxide, γ-butyrolactone, and dimethylacrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone may be added alone, or combinations of several kinds of them may be added. After the development, a rinsing treatment is conducted using water. In the rinsing treatment, a solution prepared by adding alcohols such as ethanol and isopropyl alcohol, and esters such as ethyl lactate and propylene glycol monomethyl ether acetate may be used.

Also, a step of conducting a baking treatment may be provided before the development. The temperature of the baking treatment is preferably within a range from 50 to 180° C., and more preferably from 60 to 150° C. Although there are no restrictions on the time of the baking treatment, the time of the baking treatment is preferably from 10 seconds to several hours in view of developability after the baking treatment.

After the development, the photosensitive resin composition film is converted into a heat resistant resin film by heating to a temperature within a range from 120 to 280° C. This heat treatment is conducted for 5 minutes to 5 hours while raising the temperature to a selected temperature in a stepwise manner, or continuously raising the temperature to a selected temperature within a selected temperature range. For example, the heat treatment is conducted at 130° C., 200° C. and 350° C. each for 30 minutes. Alternatively, the temperature is linearly raised from room temperature to 400° C. over 2 hours.

The heat resistant resin film formed of the photosensitive resin composition of the present invention can be used in applications such as a passivation film of a semiconductor, a protective film of a semiconductor device, an interlayer insulating film of a multilayer interconnection for high density mounting, a wiring protective insulating film of a circuit board, and a protective insulating film of an electrode on a substrate of a display device using an organic electroluminescence element.

EXAMPLES

The present invention will now be described by way of Examples, but is not limited by the following Examples. The photosensitive resin compositions in the Examples were evaluated by the following methods.

Imidation Ratio of Synthesized Polyimide

With respect to the synthesized polyimide, an infrared absorption spectrum of a polymer was measured first and the presence of absorption peaks (about 1,780 $cm^{-1}$, about 1,377 $cm^{-1}$) of an imide structure, assigned to a polyimide, were confirmed. Then, the polymer was subjected to a heat treatment at 350° C. for one hour and the infrared absorption spectrum was measured again and, furthermore, a peak strength at about 1,377 $cm^{-1}$ before the heat treatment was compared with that after the heat treatment. Assuming that the imidation ratio of the polymer after the heat treatment is 100%, the imidation ratio of the polymer before the heat treatment was determined.

Formation of Photosensitive Resin Composition Film

On a 6 inch silicone wafer, a photosensitive resin composition (hereinafter referred to as a varnish) was applied so that the film formed after prebaking has a thickness of 30 μm, and then prebaked at 110° C. for 2 minutes using a hot plate (Mark-7 manufactured by Tokyo Electron Limited) to obtain a photosensitive resin composition film.

Method for Measurement of Film Thickness

Using LAMBDA ACE STM-602 manufactured by Dainippon Screen Mfg. Co., Ltd., the film thickness was measured at a refractive index of 1.63.

Exposure

A reticle with a pattern formed thereon was set in an exposure apparatus (entire wavelength stepper Spectrum 3e manufactured by Ultratech, Inc.) and the photosensitive resin composition film was subjected to entire wavelength exposure at an exposure of 700 mJ/$cm^2$ (in terms of i-rays)

Development

To the exposed resin composition film, an aqueous 2.38% solution of tetramethylammonium hydroxide was sprayed at 50 rpm for 10 seconds using a development apparatus Mark-7 manufactured by Tokyo Electron Limited. Then, the resin composition film was allowed to stand at 0 rpm for 30 seconds and an operation of spraying for 10 seconds and standing for 30 seconds was repeated. The resin composition film was rinsed with water at 400 rpm and then shaken dry at 3,000 rpm for 10 seconds.

Heat Treatment (Curing)

The developed resin composition film was subjected to a heat treatment under the conditions of the treating temperature and the treating time described in each Example using an inert oven INH-21CD (manufactured by Koyo Thermo System Co., Ltd.)

Evaluation of Alkaline Developability

It was evaluated whether or not the unexposed area of the resin composition film is dissolved in an alkaline developing solution upon development to form a pattern.

Measurement of Residual Film Rate and Shrinkage Residual Film Rate

A residual film rate and a shrinkage residual film rate were calculated according to the following equations.

Residual Film Rate(%)=(Film Thickness after Development/Film Thickness after Prebaking)×100

Shrinkage Residual Film Rate(%)=(Film Thickness after Heat Treatment/Film Thickness after Development)×100

Evaluation of Resolution

The minimum pattern size in an optimal exposure time, which enable formation of a line and space (1:1) pattern (1L/1S) having a width of 50 μm after exposure and development was determined as resolution.

Measurement of Breaking Strength, Elastic Modulus and Elongation at Breakage

A cured film on a silicone wafer was dipped in a 47% hydrofluoric acid at room temperature for 7 minutes, washed with tap water and then carefully peeled off from the silicone wafer so as not to be torn. The resulting cured film was cut into strip-shaped specimens having a width of about 1 cm and a length of about 9 cm. Each specimen was tested under the conditions of a chuck-to-chuck distance of 90 mm, a load of 25 N and a pulling speed of 50 mm/min using TENSILON RTM-100 (manufactured by ORIENTEC Co., Ltd.) and then the breaking strength, the elastic modulus and the elongation at breakage were determined in accordance with JIS K-6251. Ten specimens were tested and the respective measurement results were averaged.

Evaluation of Heat Resistance

With respect to the above peeled cured films, weight loss on heating was measured in a nitrogen atmosphere under the condition of a temperature-raising rate of 10° C./min using a thermogravimetry apparatus TGA-50 (manufactured by Shimadzu Corporation) and a temperature, at which weight loss of 5% based on the weight at the beginning of the measurement is recognized, was determined.

Synthesis Example 1

Synthesis of Active Ester Compound (I)

Under a dry nitrogen gas flow, 18.5 g (0.1 moles) of 4-carboxybenzoic acid chloride and 13.5 g (0.1 moles) of hydroxybenzotriazole were dissolved in 100 g of tetrahydrofuran (THF), followed by cooling to −15° C. To the solution, a solution prepared by dissolving 10 g (0.1 moles) of triethylamine in 50 g of THF was added dropwise so as not to increase the temperature of the reaction solution to a temperature higher than 0° C. After the completion of dropwise addition, the reaction was conducted at 25° C. for 4 hours. The resulting solution was concentrated using a rotary evaporator to obtain the active ester compound (I).

[Chemical Formula 16]

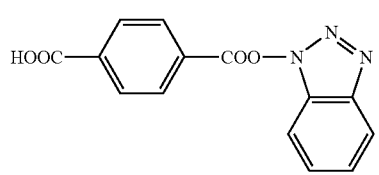

(I)

Synthesis Example 2

Synthesis of Hydroxyl Group-Containing Acid Anhydride (II)

Under a dry nitrogen gas flow, 18.3 g (0.05 moles) of 2,2-bis(3-amino-4-hydroxyphenyl)hexafluoropropane (BAHF) and 34.2 g (0.3 moles) of allyl glycidyl ether were dissolved in 100 g of gamma-butyrolactone (GBL), followed by cooling to −15° C. To the solution, a solution prepared by dissolving 22.1 g (0.11 moles) of trimellitic anhydride chloride in 50 g of GBL was added dropwise so as not to increase the temperature of the reaction solution to the temperature higher than 0° C. After the completion of dropwise addition, the reaction was conducted at 0° C. for 4 hours. The resulting solution was concentrated using a rotary evaporator and then poured into 1 L of toluene to obtain the acid anhydride (II).

[Chemical Formula 17]

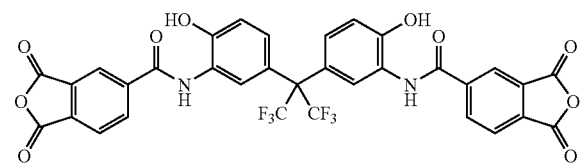

(II)

Synthesis Example 3

Synthesis of Hydroxyl Group-Containing Diamine Compound (III)

18.3 g (0.05 moles) of BAHF was dissolved in 100 mL of acetone and 17.4 g (0.3 moles) of propylene oxide, followed by cooling to −15° C. To the solution, a solution prepared by dissolving 20.4 g (0.11 moles) of 4-nitrobenzoyl chloride in 100 mL of acetone was added dropwise. After the completion of dropwise addition, the reaction was conducted at −15° C. for 4 hours and the temperature was returned to room temperature. The precipitated white powder was collected by filtration and then vacuum-dried at 50° C.

30 g of the resulting powder was placed in a 300 mL stainless steel autoclave and dispersed in 250 mL of methyl cellosolve, and then 2 g of 5% palladium-carbon was added. After introducing hydrogen through a balloon, the reduction reaction was conducted at room temperature. After about 2 hours, it was confirmed that the balloon is not deflated furthermore, and thus the reaction was terminated. After the completion of the reaction, a palladium compound as a catalyst was removed by filtration and the filtrate was concentrated using a rotary evaporator to obtain the diamine compound (III). The resulting powder was used for the reaction as it is.

[Chemical Formula 18]

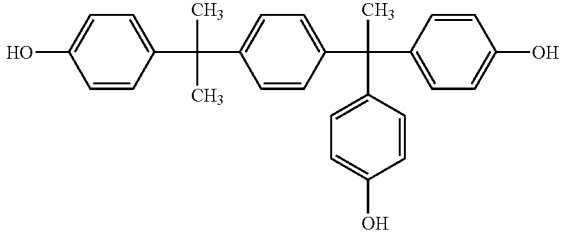

(III)

Thermocrosslinkable compound agents, compounds having a phenolic hydroxyl group, and coloring agents used in the respective Examples and Comparative Examples are shown below.

[Chemical Formula 19]

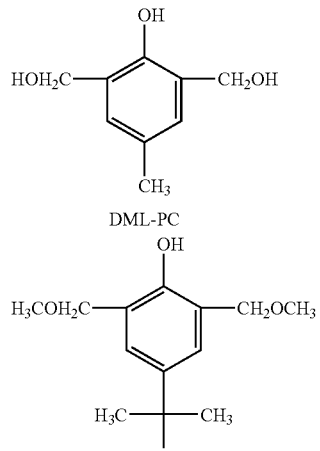

TrisP-PA

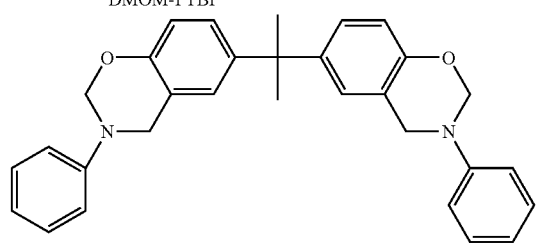

DML-PC

DMOM-PTBP

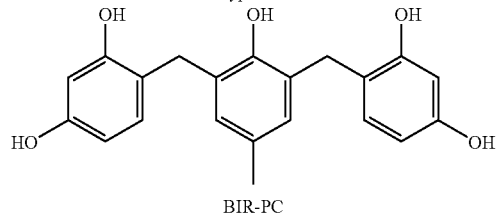

B-a type benzoxazine

BIR-PC

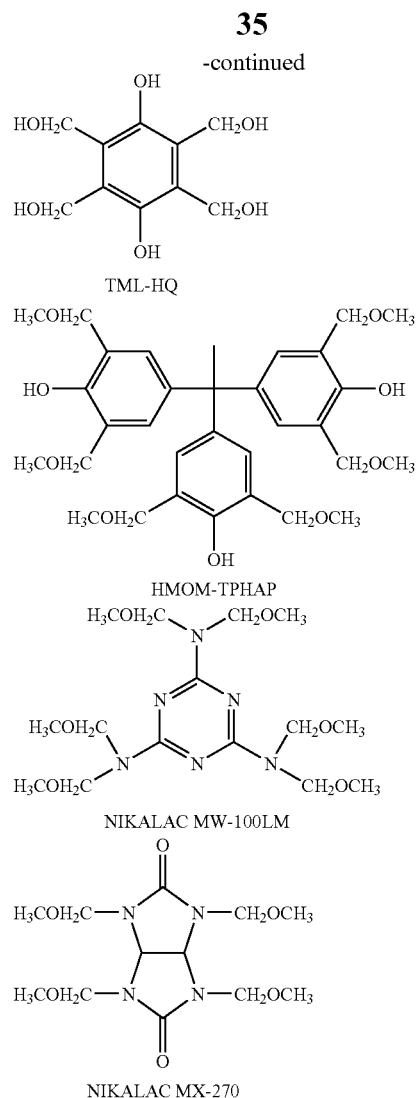
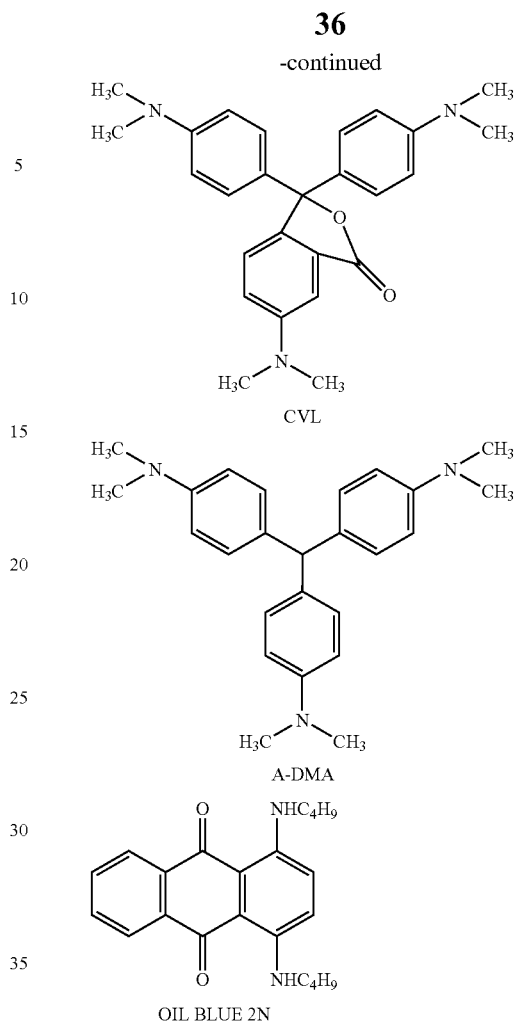
Polymerizable compounds used in the respective Examples and Comparative Examples are shown below.
[Chemical Formula 20]
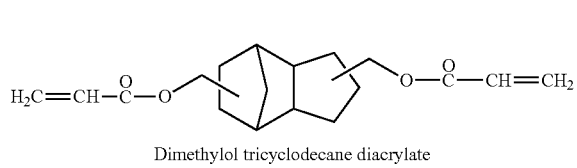
Dimethylol tricyclodecane diacrylate
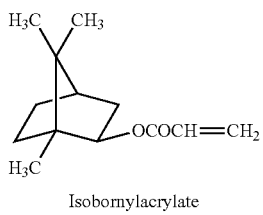
Isobornylacrylate
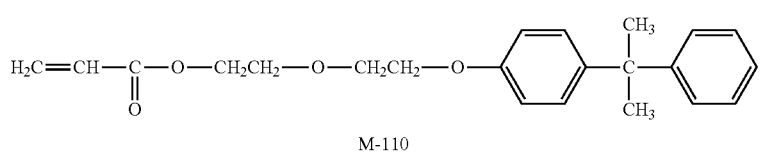
M-110
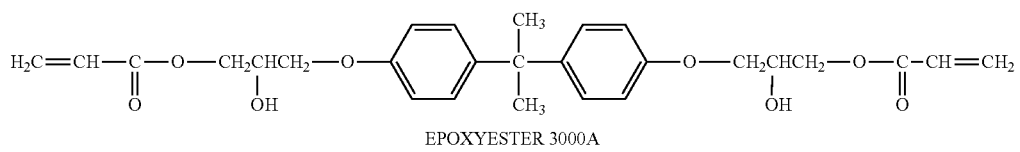
EPOXYESTER 3000A

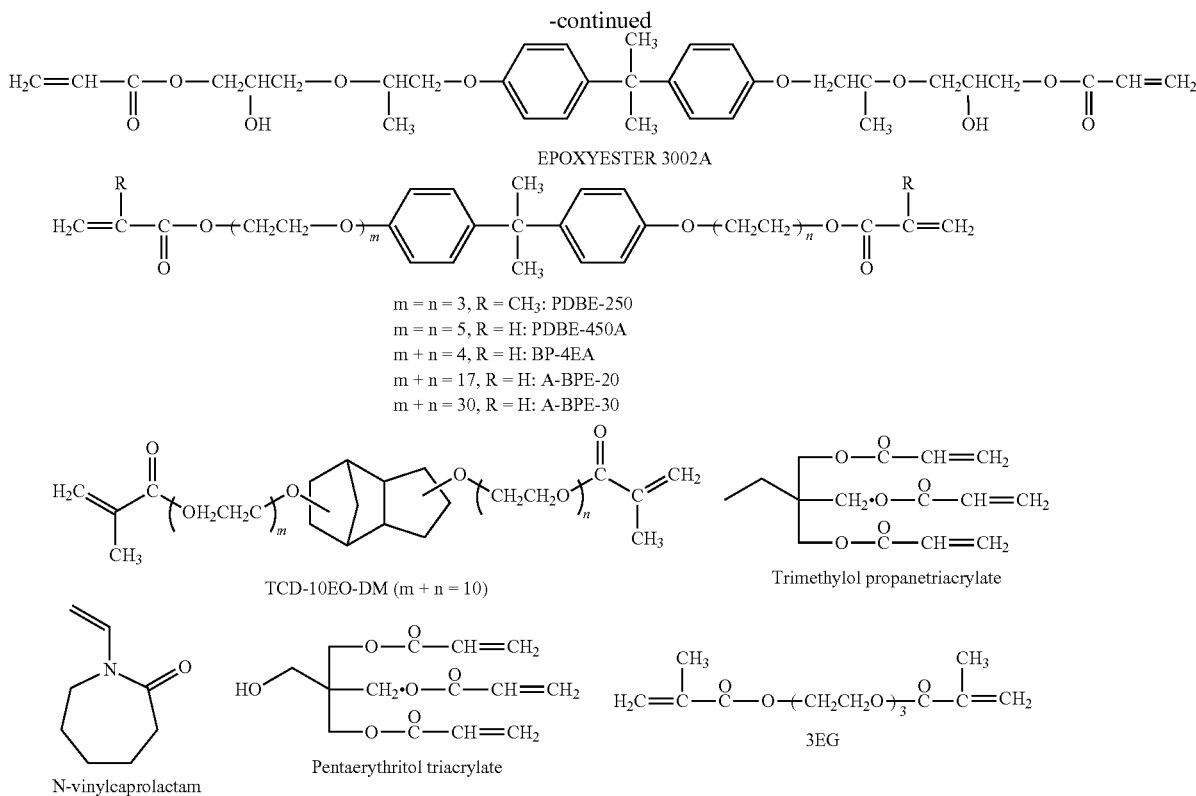

Example 1

Under a dry nitrogen gas flow, 11.41 g (0.057 moles) of 4,4'-diaminodiphenylether, 1.24 g (0.005 moles) of 1,3-bis(3-aminopropyl)tetramethyldisiloxane, and 8.18 g (0.075 moles) of 3-aminophenol (manufactured by Tokyo Chemical Industry Co., Ltd.) as an end capping agent were dissolved in 80 g of N-methyl-2-pyrrolidone (NMP). To the solution, 31.02 g (0.1 moles) of bis(3,4-dicarboxyphenyl)ether dianhydride and 20 g of NMP were added, followed by stirring at 20° C. for one hour and further stirring at 50° C. for 4 hours. Then, 15 g of xylene was added and the solution was stirred at 150° C. for 5 hours while azeotroping water and xylene. After the completion of stirring, the solution was poured into 3 L of water to obtain a white precipitate. The precipitate was collected by filtration, washed three times with water and then dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 0.5 g of bis(α-isonitrosopropiophenone oxime)isophthal as a photopolymerization initiator, 1 g of NIKALAC MX-270 (trade name, manufactured by Sanwa Chemical Co., Ltd.) as a thermocrosslinkable compound, 2 g of TrisP-PA (trade name, manufactured by Honshu Chemical Industry Co., Ltd.), 4.0 g of PDBE-250 (trade name, manufactured by NOF CORPORATION, an unsaturated bond-containing polymerizable compound) and 1.0 g of trimethylolpropane triacrylate (an unsaturated bond-containing polymerizable compound) were dissolved in 12 g of ethyl lactate to obtain a varnish A as a negative photosensitive polyimide composition. Using the resulting varnish A, a photosensitive resin composition film was formed on a silicone wafer, as described above, and exposure, post exposure baking, alkaline development and heat treatment at 170° C. for 60 minutes were conducted, and then alkaline developability, the residual film rate, the shrinkage residual film rate, resolution, the breaking strength, the elastic modulus, the elongation at breakage and heat resistance were evaluated.

Example 2

Under a dry nitrogen gas flow, 49.57 g (0.082 moles) of the hydroxyl group-containing diamine compound (III) obtained in Synthesis Example 3 and 9.91 g (0.035 moles) of the active ester compound (I) as an end capping agent were dissolved in 150 g of N-methyl-2-pyrrolidone (NMP). To the solution, 31.02 g (0.1 moles) of bis(3,4-dicarboxyphenyl)ether dianhydride and 30 g of NMP were added, followed by stirring at 20° C. for one hour and further stirring at 50° C. for 4 hours. Then, the solution was stirred at 180° C. for 5 hours. After the completion of stirring, the solution was poured into 2 L of water to obtain a white precipitate. The precipitate was collected by filtration, washed three times with water and then dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 2.5 g of 2-benzyl-2-dimethylamino-1-(4-morpholinophenyl)-butan-1-one as a photopolymerization initiator, 4.8 g of Epoxy Ester 3000A (trade name, manufactured by Kyoeisha Chemical Co., Ltd., an unsaturated bond-containing polymerizable compound), 3.2 g of isobornyl acrylate (an unsaturated bond-containing polymerizable compound), 5 g of DML-PC (trade name, manufactured by Honshu Chemical Industry Co., Ltd.) as a thermocrosslinkable compound and 1 g of vinyltrimethoxysilane were dissolved in 10 g of 3-methyl-3-methoxybutanol to obtain a varnish B as a negative photosensitive polyimide composition. Using the resulting varnish B, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Example 3

Under a dry nitrogen gas flow, 40.5 g (0.067 moles) of the hydroxyl group-containing diamine compound (III) obtained in Synthesis Example 3 and 1.24 g (0.005 moles) of 1,3-bis(3-aminopropyl)tetramethyldisiloxane were dissolved in 130 g of NMP. To the solution, 29.42 g (0.1 moles) of 3,3',4,4'-biphenyltetracarboxylic dianhydride and 20 g of NMP were added, followed by stirring at 20° C. for one hour and further stirring at 50° C. for 2 hours. To the solution, 6.89 g (0.055 moles) of 4-aminothiophenol (manufactured by Tokyo Chemical Industry Co., Ltd.) was added, followed by stirring at 50° C. for 2 hours and further stirring at 180° C. for 5 hours. After the completion of stirring, the solution was poured into 3 L of water to obtain a white precipitate. The precipitate was collected by filtration, washed three times with water and then dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 1.0 g of N-phenylglycine as a photopolymerization initiator, 1.5 g of bis(α-isonitrosopropiophenone oxime)isophthal, 0.3 g of a thermocrosslinkable compound TML-HQ (trade name, manufactured by Honshu Chemical Industry Co., Ltd.), 2.7 g of M-110 (trade name, manufactured by Toa Gosei Co., Ltd., an unsaturated bond-containing polymerizable compound) and 2.7 g of dimethyloltricyclodecane diacrylate (an unsaturated bond-containing polymerizable compound) were dissolved in 13 g of propylene glycol monomethyl ether to obtain a varnish C as a negative photosensitive polyimide composition. Using the resulting varnish C, a photosensitive resin composition film was formed on a silicone wafer, as described above, and exposure, post exposure baking, alkaline development and heat treatment at 150° C. for 60 minutes were conducted, and then alkaline developability, the residual film rate, the shrinkage residual film rate, resolution, the breaking strength, the elastic modulus, the elongation at breakage and heat resistance were evaluated.

Example 4

Under a dry nitrogen gas flow, 30.03 g (0.082 moles) of 2,2-bis(3-amino-4-hydroxyphenyl)hexafluoropropane (BAHF), 1.24 g (0.005 moles) of 1,3-bis(3-aminopropyl)tetramethyldisiloxane and 4.1 g (0.025 moles) of 3-hydroxyphthalic anhydride (manufactured by Tokyo Chemical Industry Co., Ltd.) as an end capping agent were dissolved in 100 g of N-methyl-2-pyrrolidone (NMP). To the solution, 31.02 g (0.1 moles) of bis(3,4-dicarboxyphenyl)ether dianhydride and 30 g of NMP were added, followed by stirring at 20° C. for one hour and further stirring at 50° C. for 4 hours. Then, the solution was stirred at 180° C. for 5 hours. After the completion of stirring, the solution was poured into 3 L of water to obtain a white precipitate. The precipitate was collected by filtration, washed three times with water and then dried using a vacuum dryer at 200° C. for 5 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 0.4 g of 1,2-octandione-1-[4-(phenylthio)phenyl]-2-(o-benzoyloxime), 1.5 g of NIKALAC MW-100LM (trade name, manufactured by Sanwa Chemical Co., Ltd.) as a thermocrosslinkable compound, 0.3 g of A-DMA (trade name, manufactured by Hodogaya Chemical Co., Ltd.) as a coloring agent, 8 g of PDBE-250 (trade name, manufactured by NOF CORPORATION, an unsaturated bond-containing polymerizable compound) and 2 g of dimethyloltricyclodecane diacrylate (an unsaturated bond-containing polymerizable compound) were dissolved in 10 g of diacetone alcohol to obtain a varnish D as a negative photosensitive polyimide composition. Using the resulting varnish D, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Example 5

10 g of the polymer powder obtained in Example 4, 3 g of 2-benzyl-2-dimethylamino-1-(4-morpholinophenyl)-butan-1-one as a photopolymerization initiator, 1.5 g of HMOM-TPHAP (trade name, manufactured by Honshu Chemical Industry Co., Ltd.) as a thermocrosslinkable compound, 0.1 g of OIL BLUE 2N (trade name, manufactured by Orient Chemical Industries, Ltd.) as a coloring agent, 0.2 g of CVL (trade name, manufactured by Hodogaya Chemical Co., Ltd.) as a coloring agent, 1 g of BP-4EA (trade name, manufactured by Kyoeisha Chemical Co., Ltd., an unsaturated bond-containing polymerizable compound) and 4 g of isobornyl acrylate (an unsaturated bond-containing polymerizable compound) were dissolved in 13 g of ethyl lactate to obtain a varnish E as a negative photosensitive polyimide composition. Using the resulting varnish E, a photosensitive resin composition film was formed on a silicone wafer, as described above, and exposure, post exposure baking, alkaline development and heat treatment at 200° C. for 60 minutes were conducted, and then alkaline developability, the residual film rate, the shrinkage residual film rate, resolution, the breaking strength, the elastic modulus, the elongation at breakage and heat resistance were evaluated.

Example 6

10 g of the polymer powder obtained in Example 3, 1 g of 1-phenyl-1,2-butanedion-2-(o-methoxycarbonyl)oxime as a photopolymerization initiator, 1.7 g of a thermocrosslinkable compound DMOM-PTBP (trade name, manufactured by Honshu Chemical Industry Co., Ltd.), 1.5 g of BIR-PC (trade name, manufactured by Asahi Organic Chemicals Industries Co., Ltd.), 4.5 g of Epoxy Ester 3002A (trade name, manufactured by Kyoeisha Chemical Co., Ltd., an unsaturated bond-containing polymerizable compound) and 0.5 g of dimethyloltricyclodecane diacrylate (an unsaturated bond-containing polymerizable compound) were dissolved in 12 g of γ-butyrolactone and 8 g of cyclopentanone to obtain a varnish F as a negative photosensitive polyimide composition. Using the resulting varnish F, a photosensitive resin composition film was formed on a silicone wafer, as described above, and exposure, post exposure baking, alkaline development and heat treatment at 210° C. for 30 minutes were conducted, and then alkaline developability, the residual film rate, the shrinkage residual film rate, resolution, the breaking strength, the elastic modulus, the elongation at breakage and heat resistance were evaluated.

Example 7

10 g of the polymer powder obtained in Example 3, 1.0 g of N-phenylglycine as a photopolymerization initiator, 1.5 g of bis(α-isonitrosopropiophenone oxime)isophthal, 0.3 g of a thermocrosslinkable compound TML-HQ (trade name, manufactured by Honshu Chemical Industry Co., Ltd.), 1.5 g of M-110 (trade name, manufactured by Toa Gosei Co., Ltd., an unsaturated bond-containing polymerizable compound) and 3.5 g of isobornyl acrylate (an unsaturated bond-containing polymerizable compound) were dissolved in 13 g of propylene glycol monomethyl ether 13 g to obtain a varnish G as a negative photosensitive polyimide composition. Using the resulting varnish G, a photosensitive resin composition film was formed on a silicone wafer, as described above, and exposure, post exposure baking, alkaline development and heat treatment at 150° C. for 60 minutes were conducted, and then alkaline developability, the residual film rate, the shrinkage residual film rate, resolution, the breaking strength, the elastic modulus, the elongation at breakage and heat resistance were evaluated.

Example 8

10 g of the polymer powder obtained in Example 4, 0.4 g of 1,2-octandione-1-[4-(phenylthio)phenyl]-2-(o-benzoyloxime) as a photopolymerization initiator, 1.5 g of a thermocrosslinkable compound NIKALAC MW-100LM (trade name, manufactured by Sanwa Chemical Co., Ltd.), 4.75 g of PDBE-250 (trade name, manufactured by NOF CORPORATION, an unsaturated bond-containing polymerizable compound) and 0.25 g of dimethyloltricyclodecane diacrylate (an unsaturated bond-containing polymerizable compound) were dissolved in 10 g of diacetone alcohol to obtain a varnish H as a negative photosensitive polyimide composition. Using the resulting varnish H, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Example 9

10 g of the polymer powder obtained in Example 1, 0.5 g of 1-phenyl-1,2-butanedion-2-(o-methoxycarbonyl)oxime as a photopolymerization initiator, 0.8 g of a thermocrosslinkable compound B-a type benzooxazine (trade name, manufactured by Shikoku Chemicals Corporation), 2.5 g of BIR-PC (trade name, manufactured by Asahi Organic Chemicals Industries Co., Ltd.), 2.8 g of A-BPE-20 (trade name, manufactured by Shin-nakamura Chemical Corporation, an unsaturated bond-containing polymerizable compound), 0.8 g of isobornyl acrylate (an unsaturated bond-containing polymerizable compound) and 0.4 g of trimethylolpropane triacrylate (an unsaturated bond-containing polymerizable compound) were dissolved in 15 g of diacetone alcohol to obtain a varnish I as a negative photosensitive polyimide composition. Using the resulting varnish I, a photosensitive resin composition film was formed on a silicone wafer, as described above, and exposure, post exposure baking, alkaline development and heat treatment at 180° C. for 30 minutes were conducted, and then alkaline developability, the residual film rate, the shrinkage residual film rate, resolution, the breaking strength, the elastic modulus, the elongation at breakage and heat resistance were evaluated.

Example 10

10 g of the polymer powder obtained in Example 2, 0.5 g of 2-benzyl-2-dimethylamino-1-(4-morpholinophenyl)-butan-1-one as a photopolymerization initiator, 0.8 g of a thermocrosslinkable compound TML-HQ (trade name, manufactured by Honshu Chemical Industry Co., Ltd.), 2.5 g of TrisP-PA (trade name, manufactured by Honshu Chemical Industry Co., Ltd.), 2.0 g of A-BPE-20 (trade name, manufactured by Shin-nakamura Chemical Corporation, an unsaturated bond-containing polymerizable compound), 1.2 g of dimethyloltricyclodecane diacrylate (an unsaturated bond-containing polymerizable compound) and 0.8 g of N-vinyl caprolactam (an unsaturated bond-containing polymerizable compound) were dissolved in 15 g of diacetone alcohol to obtain a varnish J as a negative photosensitive polyimide composition. Using the resulting varnish J, a photosensitive resin composition film was formed on a silicone wafer, as described above, and exposure, post exposure baking, alkaline development and heat treatment at 180° C. for 30 minutes were conducted, and then alkaline developability, the residual film rate, the shrinkage residual film rate, resolution, the breaking strength, the elastic modulus, the elongation at breakage and heat resistance were evaluated.

Example 11

10 g of the polymer powder obtained in Example 3, 1 g of 1-phenyl-1,2-butanedion-2-(o-methoxycarbonyl)oxime as a photopolymerization initiator, 1.5 g of BIR-PC (trade name, manufactured by Asahi Organic Chemicals Industries Co., Ltd.), 4.5 g of BP-4EA (trade name, manufactured by Kyoeisha Chemical Co., Ltd., an unsaturated bond-containing polymerizable compound) and 0.5 g of isobornyl acrylate (an unsaturated bond-containing polymerizable compound) were dissolved in 12 g of γ-butyrolactone and 8 g of cyclopentanone to obtain a varnish K as a negative photosensitive polyimide composition. Using the resulting varnish K, a photosensitive resin composition film was formed on a silicone wafer, as described above, and exposure, post exposure baking, alkaline development and heat treatment at 210° C. for 30 minutes were conducted, and then alkaline developability, the residual film rate, the shrinkage residual film rate, resolution, the breaking strength, the elastic modulus, the elongation at breakage and heat resistance were evaluated.

Example 12

In the same manner as in Example 1, except that PDBE-450A (trade name, manufactured by NOF CORPORATION, an unsaturated bond-containing polymerizable compound)

was used as the unsaturated bond-containing polymerizable compound in place of PDBE-250 and trimethylolpropane triacrylate, a varnish L as a photosensitive polyimide composition was obtained. Using the resulting varnish L, a photosensitive resin composition film was formed on a silicone wafer, as described above, and exposure, post exposure baking, alkaline development and heat treatment at 200° C. for 60 minutes were conducted, and then alkaline developability, the residual film rate, the shrinkage residual film rate, resolution, the breaking strength, the elastic modulus, the elongation at breakage and heat resistance were evaluated.

Example 13

Under a dry nitrogen gas flow, 11.41 g (0.057 moles) of 4,4'-diaminodiphenylether, 1.24 g (0.005 moles) of 1,3-bis(3-aminopropyl)tetramethyldisiloxane, and 8.18 g (0.075 moles) of 3-aminophenol (manufactured by Tokyo Chemical Industry Co., Ltd.) as an end capping agent were dissolved in 80 g of N-methyl-2-pyrrolidone (NMP). To the solution, 31.02 g (0.1 moles) of bis(3,4-dicarboxyphenyl)ether dianhydride and 20 g of NMP were added, followed by stirring at 20° C. for one hour and further stirring at 50° C. for 4 hours. Then, a solution prepared by diluting 15.19 g (0.127 moles) of N,N-dimethylformamide dimethylacetal with 4 g of NMP was added dropwise over 10 minutes. After the completion of dropwise addition, the solution was stirred at 50° C. for 3 hours. After the completion of the reaction, the solution was poured into 2 L of water and the precipitate of a polymer powder was obtained by filtration. The precipitate was collected by filtration, washed three times with water, and then the polymer powder was dried using a vacuum dryer at 80° C. for 20 hours. The resulting polymer powder was measured by infrared absorption spectrum. As a result, absorption peaks of an imide structure, assigned to a polyimide, were not detected at about 1,780 cm$^-$ and about 1,377 cm$^{-1}$. Then, 8.5 g of the polymer powder, 1.5 g of the polymer powder obtained in Example 1, 0.5 g of bis(α-isonitrosopropiophenone oxime) isophthal as a photopolymerization initiator, 1 g of NIKA-LAC MX-270 (trade name, manufactured by Sanwa Chemical Co., Ltd.) as a thermocrosslinkable compound, 2 g of TrisP-PA, 4 g of PDBE-250 (trade name, manufactured by NOF CORPORATION, an unsaturated bond-containing polymerizable compound) and 1 g of isobornyl acrylate (an unsaturated bond-containing polymerizable compound) were dissolved in 12 g of ethyl lactate to obtain a varnish M as a negative photosensitive polyimide composition. Using the resulting varnish M, a photosensitive resin composition film was formed on a silicone wafer, as described above, and exposure, post exposure baking, alkaline development and heat treatment at 170° C. for 60 minutes were conducted, and then alkaline developability, the residual film rate, the shrinkage residual film rate, resolution, the breaking strength, the elastic modulus, the elongation at breakage and heat resistance were evaluated.

Example 14

Under a dry nitrogen gas flow, 30.03 g (0.082 moles) of 2,2-bis(3-amino-4-hydroxyphenyl)hexafluoropropane (BAHF), 1.24 g (0.005 moles) of 1,3-bis(3-aminopropyl)tetramethyldisiloxane and 2.73 g (0.025 moles) of 3-aminophenol (manufactured by Tokyo Chemical Industry Co., Ltd.) as an end capping agent were dissolved in 100 g of N-methyl-2-pyrrolidone (NMP). To the solution, 31.02 g (0.1 moles) of bis(3,4-dicarboxyphenyl)ether dianhydride and 30 g of NMP were added, followed by stirring at 20° C. for one hour and further stirring at 50° C. for 4 hours. Then, a solution prepared by diluting 15.19 g (0.127 moles) of N,N-dimethylformamide dimethylacetal with 4 g of NMP was added dropwise over 10 minutes. After the completion of dropwise addition, the solution was stirred at 5° C. for 3 hours. After the completion of the reaction, the solution was poured into 2 L of water and the precipitate of a polymer powder was obtained by filtration. The precipitate was collected by filtration, washed three times with water, and then the polymer powder was dried using a vacuum dryer at 80° C. for 20 hours. The resulting polymer powder was measured by infrared absorption spectrum. As a result, absorption peaks of an imide structure, assigned to a polyimide, were not detected at about 1,780 cm$^{-1}$ and about 1,377 cm$^{-1}$. Then, 5 g of the polymer powder, 5 g of the polymer powder obtained in Example 5, 0.4 g of 1,2-octandione-1-[4-(phenylthio)phenyl]-2-(o-benzoyloxime) as a photopolymerization initiator, 1.5 g of NIKA-LAC MW-100LM (trade name, manufactured by Sanwa Chemical Co., Ltd.) as a thermocrosslinkable compound, 4 g of A-BPE-20 (trade name, manufactured by Shin-nakamura Chemical Corporation, an unsaturated bond-containing polymerizable compound) and 6 g of dimethyloltricyclodecane diacrylate (an unsaturated bond-containing polymerizable compound) were dissolved in 10 g of diacetone alcohol to obtain a varnish N as a negative photosensitive polyimide composition. Using the resulting varnish N, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Example 15

Under a dry nitrogen gas flow, 30.03 g (0.082 moles) of 2,2-bis(3-amino-4-hydroxyphenyl)hexafluoropropane (BAHF), 1.24 g (0.005 moles) of 1,3-bis(3-aminopropyl)tetramethyldisiloxane and 2.73 g (0.025 moles) of 3-aminophenol (manufactured by Tokyo Chemical Industry Co., Ltd.) as an end capping agent were dissolved in 100 g of N-methyl-2-pyrrolidone (NMP). To the solution, 31.02 g (0.10 moles) of bis(3,4-dicarboxyphenyl)ether dianhydride and 30 g of NMP were added, followed by stirring at 20° C. for one hour and further stirring at 50° C. for 4 hours. Then, a solution prepared by diluting 15.19 g (0.127 moles) of N,N-dimethylformamide dimethylacetal with 4 g of NMP was added dropwise over 10 minutes. After the completion of dropwise addition, the solution was stirred at 80° C. for 7 hours. After the completion of the reaction, the solution was poured into 2 L of water and the precipitate of a polymer powder was obtained by filtration. The precipitate was collected by filtration, washed three times with water, and then the polymer powder was dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 5 g of the polymer powder obtained in Example 5, 0.4 g of 1,2-octandione-1-[4-(phenylthio)phenyl]-2-(o-benzoyloxime) as a photopolymerization initiator, 1.5 g of HMOM-TPHAP (trade name, manufactured by Honshu Chemical Industry Co., Ltd.) as a thermocrosslinkable compound, 1.5 g of BIR-PC (trade name, manufactured by Asahi Organic Chemicals Industries Co., Ltd.), 7 g of Epoxy Ester 3000A (trade name, manufactured by Kyoeisha Chemical Co., Ltd., an unsaturated bond-containing polymerizable compound) and 3 g of isobornyl acrylate (an unsaturated bond-containing polymerizable compound) were dissolved in 10 g of propylene glycol monomethyl ether to obtain a varnish O as a negative photosensitive polyimide composition. Using the resulting varnish O, a photosensitive resin composition film was formed on a silicone wafer, as described above, and exposure, post-exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 1

Under a dry nitrogen gas flow, 11.41 g (0.057 moles) of 4,4'-diaminodiphenylether, 1.24 g (0.005 moles) of 1,3-bis(3-aminopropyl)tetramethyldisiloxane, and 8.18 g (0.075 moles) of 3-aminophenol (manufactured by Tokyo Chemical Industry Co., Ltd.) as an end capping agent were dissolved in 80 g of N-methyl-2-pyrrolidone (NMP). To the solution, 31.02 g (0.10 moles) of bis(3,4-dicarboxyphenyl)ether dianhydride and 20 g of NMP were added, followed by stirring at 20° C. for one hour and further stirring at 5° C. for 4 hours. Then, a solution prepared by diluting 15.19 g (0.127 moles) of N,N-dimethylformamide dimethylacetal with 4 g of NMP was added dropwise over 10 minutes. After the completion of dropwise addition, the solution was stirred at 50° C. for 3 hours. After the completion of the reaction, the solution was poured into 2 L of water and the precipitate of a polyimide precursor polymer powder was obtained by filtration. The polyimide precursor polymer powder was collected by filtration, washed three times with water, and then the polyimide precursor polymer powder was dried using a vacuum dryer at 80° C. for 20 hours. The resulting polyimide precursor polymer powder was measured by infrared absorption spectrum. As a result, absorption peaks of an imide structure, assigned to a polyimide, were not detected at about 1,780 cm$^{-1}$ and about 1,377 cm$^{-1}$. 10 g of the obtained polyimide precursor polymer, 0.5 g of bis($\alpha$-isonitrosopropiophenone oxime) isophthal as a photopolymerization initiator, 1 g of a thermocrosslinkable compound. NIKALAC MX-270 (trade name, manufactured by Sanwa Chemical Co., Ltd.), 2 g of TrisP-PA, and 5 g of PDBE-250 (an unsaturated bond-containing polymerizable compound) were dissolved in 12 g of $\gamma$-butyrolactone to obtain a varnish P as a negative photosensitive polyimide composition. Using the resulting varnish P, a photosensitive resin composition film was formed on a silicone wafer, as described above, and exposure, post exposure baking, alkaline development and heat treatment at 170° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 2

In the same manner as in Example 3, except that 5.4 g of 3EG (trade name, manufactured by Kyoeisha Chemical Co., Ltd.) was used as the unsaturated bond-containing polymerizable compound in place of M-110 and dimethyloltricyclodecane diacrylate, a varnish Q as a photosensitive resin composition film was obtained. Using the resulting varnish Q, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 3

In the same manner as in Example 4, except that A-BPE-30 (manufactured by Shin-nakamura Chemical Corporation) was used as the unsaturated bond-containing polymerizable compound in place of PDBE-250, a varnish R as a photosensitive resin composition film was obtained. Using the resulting varnish R, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 4

In the same manner as in Example 5, except that pentaerythritol triacrylate was used as the unsaturated bond-containing polymerizable compound in place of BP-4EA and trimethylolpropane triacrylate was used in place of isobornyl acrylate, a varnish S as a photosensitive resin composition film was obtained. Using the resulting varnish S, a photosensitive resin composition film was formed on a silicone wafer, as described above, and exposure, post exposure baking, alkaline development and heat treatment at 200° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 5

In the same manner as in Example 11, except that TCD-10EO-DM (trade name, manufactured by Shin-nakamura Chemical Corporation, a compound having a polymerizable unsaturated double bond) was used as the unsaturated bond-containing polymerizable compound in place of BP-4EA and isobornyl acrylate, a varnish T as a photosensitive resin composition film was obtained. Using the resulting varnish T, a photosensitive resin composition film was formed on a silicone wafer, as described above, and exposure, post exposure baking, alkaline development and heat treatment at 200° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 6

In the same manner as in Example 14, except that 3EG was used as the unsaturated bond-containing polymerizable compound in place of A-BPE-20 and isobornyl acrylate (an unsaturated bond-containing polymerizable compound) was used in place of dimethylolcyclodecane triacrylate, a varnish U as a photosensitive resin composition film was obtained. Using the resulting varnish U, a photosensitive resin composition film was formed on a silicone wafer, as described above, and exposure, post exposure baking, alkaline development and heat treatment at 200° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 7

In a 1,000 ml four-necked flask, 100 g of isopropyl alcohol was charged and the flask was maintained in an oil bath at 80° C. While conducting nitrogen sealing and stirring, a mixture of 40.48 g (0.4 moles) of methyl methacrylate (manufactured by Wako Pure Chemical Industries, Ltd.), 25.83 g (0.3 moles) of methacrylic acid and 2 g of N,N-azobisisobutyronitrile was added dropwise over 30 minutes using a dropping funnel. After the reaction was continued for 4 hours, 1 g of hydroquinone monomethyl ether was added. The temperature was returned to normal temperature, and thus polymerization was completed. To the nonphotopolymerizable polymer thus obtained, 10 g of isopropyl alcohol was added. While maintaining at 75° C., 42.65 g (0.3 moles) of glycidyl methacrylate and 3 g of triethylbenzylammonium chloride were added, and then the reaction was conducted for 3 hours. The resulting polymer solution having photopolymerization reactivity was poured into 1 L of n-hexane and the precipitate was collected by filtration. The resulting solid was dried under vacuum at 40° C. for 24 hours to obtain 120 g of a polymer solid having photopolymerization reactivity. The reaction rate of glycidyl methacrylate was determined from a change in an acid value of the polymer before and after the reaction was 70%. Therefore, the addition amount was 0.73 mol equivalents.

The polymer solid thus obtained, 0.5 g of bis(α-isonitrosopropiophenone oxime)isophthal as a photopolymerization initiator, 1 g of a thermocrosslinkable compound NIKALAC MX-270 (trade name, manufactured by Sanwa Chemical Co., Ltd.), 2 g of TrisP-PA (trade name, manufactured by Honshu Chemical Industry Co., Ltd.), 4.0 g of PDBE-250 (trade name, manufactured by NOF CORPORATION) an unsaturated bond-containing polymerizable compound) and 1.0 g of trimethylolpropane triacrylate (an unsaturated bond-containing polymerizable compound) were dissolved in 12 g of ethyl lactate to obtain a varnish W as a negative photosensitive polyimide composition. Using the resulting varnish W, a photosensitive resin composition film was formed on a silicone wafer, as described above, and exposure, post exposure baking, alkaline development and heat treatment at 210° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 8

Under a dry nitrogen gas flow, 11.41 g (0.057 moles) of 4,4'-diaminodiphenylether, 1.24 g (0.005 moles) of 1,3-bis(3-aminopropyl)tetramethyldisiloxane, and 6.98 g (0.075 moles) of aniline (manufactured by Wako Pure Chemical Industries, Ltd.) as an end capping agent were dissolved in 80 g of N-methyl-2-pyrrolidone (NMP). To the solution, 31.02 g (0.1 moles) of bis(3,4-dicarboxyphenyl)ether dianhydride and 20 g of NMP were added, followed by stirring at 20° C. for one hour and further stirring at 50° C. for 4 hours. Then, 15 g of xylene was added and the solution was stirred at 180° C. for 5 hours while azeotroping water and xylene. After the completion of stirring, the solution was poured into 3 L of water to obtain a white precipitate. The precipitate was collected by filtration, washed three times with water and then dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 0.5 g of bis(α-isonitrosopropiophenone oxime)isophthal as a photopolymerization initiator, 1 g of NIKALAC MX-270 (trade name, manufactured by Sanwa Chemical Co., Ltd.) as a thermocrosslinkable compound, 2 g of TrisP-PA (trade name, manufactured by Honshu Chemical Industry Co., Ltd.), 4.0 g of PDBE-250 (trade name, manufactured by NOF CORPORATION, an unsaturated bond-containing polymerizable compound) and 1.0 g of dimethyloltricyclodecane diacrylate (an unsaturated bond-containing polymerizable compound) were dissolved in 12 g of ethyl lactate to obtain a varnish X as a negative photosensitive polyimide composition. Using the resulting varnish X, a photosensitive resin composition film was formed on a silicone wafer, as described above, and exposure, post exposure baking, alkaline development and heat treatment at 170° C. for 60 minutes were conducted, and then alkaline developability, the residual film rate, the shrinkage residual film rate, resolution, the breaking strength, the elastic modulus, the elongation at breakage and heat resistance were evaluated.

Comparative Example 9

Under a dry nitrogen gas flow, 49.57 g (0.082 moles) of the hydroxyl group-containing diamine compound (III) obtained in Synthesis Example 3 was dissolved in 150 g of N-methyl-2-pyrrolidone (NMP). To the solution, 31.02 g (0.1 moles) of bis(3,4-dicarboxyphenyl)ether dianhydride and 30 g of NMP were added, followed by stirring at 20° C. for one hour and further stirring at 50° C. for 4 hours. Then, the solution was stirred at 180° C. for 5 hours. After the completion of stirring, the solution was poured into 2 L of water to obtain a white precipitate. The precipitate was collected by filtration, washed three times with water and then dried using a vacuum dryer at 80° C. for 20 hours. The resulting polymer powder was measured by infrared absorption spectrum. As a result, absorption peaks of an imide structure, assigned to a polyimide, were detected at about 1,780 cm$^{-1}$ and about 1,377 cm$^{-1}$. With respect to the polymer powder thus obtained, the imidation ratio was examined first. Then, 10 g of the polymer powder, 2.5 g of 2-benzyl-2-dimethylamino-1-(4-morpholinophenyl)-butan-1-one as a photopolymerization initiator, 4.8 g of Epoxy Ester 3000A (trade name, manufactured by Kyoeisha Chemical Co., Ltd., an unsaturated bond-containing polymerizable compound), 3.2 g of isobornyl acrylate (an unsaturated bond-containing polymerizable compound), 5 g of a thermocrosslinkable compound DML-PC (trade name, manufactured by Honshu Chemical Industry Co., Ltd.) and 1 g of vinyltrimethoxysilane were dissolved in 10 g 3-methyl-3-methoxybutanol to obtain a varnish Y as a negative photosensitive polyimide composition. Using the resulting varnish Y, a photosensitive resin composition film was formed on a silicone wafer, as described above, and exposure, post exposure baking, alkaline development and heat treatment at 180° C. for 60 minutes were conducted, and then alkaline developability, the residual film rate, the shrinkage residual film rate, resolution, the breaking strength, the elastic modulus, the elongation at breakage and heat resistance were evaluated.

Compositions of the photosensitive resin compositions in Examples 1 to 15 and Comparative Example 1 to 9 are shown in Tables 1 to 3 below. Values of o, p, q, r, s, t, α and β in the case of being represented by the general formulas (1) to (5) with respect to the polyimides and the unsaturated bond-containing polymerizable compounds (b1) used in Examples 1 to 15, and Comparative Examples 1 to 9 are shown in Table 4 below. Also, the evaluation results in Examples 1 to 15 and Comparative Example 1 to 9 are shown in Tables 5 and 6 below.

TABLE 1

| | | Polyimide (a) | | | Unsaturated bond-containing polymerizable compound | | |
|---|---|---|---|---|---|---|---|
| | Varnish | Kind of polymer | End capping agent | Imidiation ratio (%) | (b1) | (b2) | (b3) |
| Example 1 | A | Polyimide 100% by weight | 3-aminophenol | 100 | PDBE-250 80% by weight | None | Trimethylolpropane triacrylate 20% by weight |
| Example 2 | B | Polyimide 100% by weight | Active ester (I) | 100 | Epoxy ester 3000A 60% by weight | Isobornyl acrylate 40% by weight | None |
| Example 3 | C | Polyimide 100% by weight | 4-aminothiophenol | 100 | M-110 50% by weight | Dimethyloltricyclodecane diacrylate 50% by weight | None |
| Example 4 | D | Polyimide 100% by weight | 3-hydroxyphthalic anhydride | 100 | PDBE-250 80% by weight | Dimethyloltricyclodecane diacrylate 20% by weight | None |
| Example 5 | E | Polyimide 100% by weight | 3-hydroxyphthalic anhydride | 100 | BP-4EA 20% by weight | Isobornyl acrylate 80% by weight | None |
| Example 6 | F | Polyimide 100% by weight | 4-aminothiophenol | 100 | Epoxy ester 3002A 90% by weight | Dimethyloltricyclodecane diacrylate 10% by weight | None |
| Example 7 | G | Polyimide 100% by weight | 4-aminothiophenol | 100 | M-110 30% by weight | Isobornyl acrylate 70% by weight | None |
| Example 8 | H | Polyimide 100% by weight | 3-hydroxyphthalic anhydride | 100 | PDBE-250 95% by weight | Dimethyloltricyclodecane diacrylate 5% by weight | None |
| Example 9 | I | Polyimide 100% by weight | 3-aminophenol | 100 | A-BPE-20 70% by weight | Isobornyl acrylate 20% by weight | Trimethylolpropane triacrylate 10% by weight |

| | Photopolymerization initiator (c) | Thermocrosslinkable compound (d) | Compound having a phenolic hydroxyl group | Solvent |
|---|---|---|---|---|
| Example 1 | Bis(α-isonitrosopropiophenone oxime)isophthal | NIKALAC MX-270 | Tris-PA | Ethyl lactate |
| Example 2 | 2-benzyl-2-dimethylamino-1-(4-morpholinophenyl)-butan-1-one | DML-PC | None | 3-methyl-3-methoxybutanol |
| Example 3 | N-phenylglycine Bis(α-isonitrosopropiophenone oxime)isophthal | TML-HQ | None | Propylene glycol monomethyl ether |
| Example 4 | 1,2-octandione-1-[4-(phenylthio)phenyl]-2-(o-benzoyloxime) | NIKALAC MW-100LM | None | Diacetone alcohol |
| Example 5 | 2-benzyl-2-dimethylamino-1-(4-morpholinophenyl)-butan-1-one | HMOM-TPHAP | BIR-PC | Ethyl lactate |
| Example 6 | 1-phenyl-1,2-butanedion-2-(o-methoxycarbonyl) oxime | DMOM-PTBP | BIR-PC | γ-butyrolactone Cyclopentanone |
| Example 7 | N-phenylglycine Bis(α-isonitrosopropiophenone oxime)isophthal | TML-HQ | None | Propylene glycol monomethyl ether |
| Example 8 | 1,2-octandione-1-[4-(phenylthio)phenyl]-2-(o-benzoyloxime) | NIKALAC MW-100LM | None | Diacetone alcohol |
| Example 9 | 1-phenyl-1,2-butanedion-2-(o-methoxycarbonyl) oxime | B-a type benzooxazine | BIR-PC | Diacetone alcohol |

TABLE 2

| | | Polyimide (a) | | | Unsaturated bond-containing polymerizable compound | | |
|---|---|---|---|---|---|---|---|
| | Varnish | Kind of polymer | End capping agent | Imidiation ratio (%) | (b1) | (b2) | (b3) |
| Example 10 | J | Polyimide 100% by weight | Active ester (I) | 100 | A-BPE-20 50% by weight | Dimethyloltricyclodecane diacrylate 30% by weight | N-vinylcaprolactam |
| Example 11 | K | Polyimide 100% by weight | 4-aminothiophenol | 100 | BP-4EA 80% by weight | Isobornyl acrylate 20% by weight | None |
| Example 12 | L | Polyimide 100% by weight | 3-aminophenol | 100 | PDBE-450A | None | None |

TABLE 2-continued

| | Varnish | Kind of polymer | End capping agent | Imidiation ratio (%) | (b1) | (b2) | (b3) |
|---|---|---|---|---|---|---|---|
| Example 13 | M | Polyimide 15% by weight Polyimide precursor 85% by weight | 3-aminophenol | 20 | PDBE-250 80% by weight | Isobornyl acrylate 20% by weight | None |
| Example 14 | N | Polyimide 50% by weight Polyimide precursor 50% by weight | 3-aminophenol 3-hydroxyphthalic anhydride | 55 | A-BPE-20 40% by weight | Dimethyloltricyclodecane diacrylate 60% by weight | None |
| Example 15 | O | Polyimide 30% by weight Polyimide precursor 70% by weight | 3-aminophenol 3-hydroxyphthalic anhydride | 35 | Epoxy ester 3000A 70% by weight | Isobornyl acrylate 30% by weight | None |

| | Photopolymerization initiator (c) | Thermocrosslinkable compound (d) | Compound having a phenolic hydroxyl group | Solvent |
|---|---|---|---|---|
| Example 10 | 2-benzyl-2-dimethylamino-1-(4-morpholinophenyl)-butan-1-one | TML-HQ | TrisP-PA | Diacetone alcohol |
| Example 11 | 1-phenyl-1,2-butanedion-2-(o-methoxycarbonyl) oxime | None | BIR-PC | γ-butyrolactone Cyclopentanone |
| Example 12 | Bis(α-isonitrosopropiophenone oxime)isophthal | NIKALAC MX-270 | TrisP-PA | Ethyl lactate |
| Example 13 | Bis(α-isonitrosopropiophenone oxime)isophthal | NIKALAC MW-270 | TrisP-PA | Ethyl lactate |
| Example 14 | 1,2-octandione-1-[4-(phenylthio)phenyl]-2-(o-benzoyloxime) | NIKALAC MW-100LM | None | Diacetone alcohol |
| Example 15 | 1,2-octandione-1-[4-(phenylthio)phenyl]-2-(o-benzoyloxime) | HMOM-TPHAP | BIR-PC | Propylene glycol monomethyl ether |

TABLE 3

| | | Polyimide (a) | | | Unsaturated bond-containing polymerizable compound | | |
|---|---|---|---|---|---|---|---|
| | Varnish | Kind of polymer | End capping agent | Imidiation ratio (%) | (b1) | (b2) | (b3) |
| Comparative Example 1 | P | Polyimide precursor 100% by weight | 3-aminophenol | 0 | PDBE-250 | None | None |
| Comparative Example 2 | Q | Polyimide 100% by weight | 4-aminothiophenol | 100 | None | None | 3EG |
| Comparative Example 3 | R | Polyimide 100% by weight | 3-hydroxyphthalic anhydride | 100 | None | Dimethyloltricyclodecane diacrylate 20% by weight | A-BPE-30 80% by weight |
| Comparative Example 4 | S | Polyimide 100% by weight | 3-hydroxyphthalic anhydride | 100 | None | None | Pentaerythritol acrylate 20% by weight Trimethylolpropane triacrylate 80% by weight |
| Comparative Example 5 | T | Polyimide 100% by weight | 4-aminothiophenol | 100 | None | TCD-10EO-DM | None |
| Comparative Example 6 | U | Polyimide 50% by weight Polyimide precursor 50% by weight | 3-aminophenol 3-hydroxyphthalic anhydride | 55 | | Isobornyl acrylate 60% by weight | 3EG 40% by weight |
| Comparative Example 7 | W | — | — | — | PDBE-250 80% by weight | None | Trimethylolpropane triacrylate 20% by weight |
| Comparative Example 8 | X | Polyimide 100% by weight | Aniline | 100 | PDBE-250 80% by weight | Dimethyloltricyclodecane diacrylate 20% by weight | None |
| Comparative Example 9 | Y | Polyimide 100% by weight | None | 100 | Epoxy ester 3000A 60% by weight | Isobornyl acrylate 40% by weight | None |

TABLE 3-continued

| | Photopolymerization initiator (c) | Thermocrosslinkable compound (d) | Compound having a phenolic hydroxyl group | Solvent |
|---|---|---|---|---|
| Comparative Example 1 | Bis(α-isonitrosopropiophenone oxime)isophthal | NIKALAC MX-270 | TrisP-PA | γ-butyrolactone |
| Comparative Example 2 | N-phenylglycine | TML-HQ | None | Propylene glycol monomethyl ether |
| Comparative Example 3 | Bis(α-isonitrosopropiophenone oxime)isophthal | | | |
| Comparative Example 3 | 1,2-octandione-1-[4-(phenylthio)phenyl]-2-(o-benzoyloxime) | NIKALAC MW-100LM | None | Diacetone alcohol |
| Comparative Example 4 | 2-benzyl-2-dimethylamino-1-(4-morpholinophenyl)-butan-1-one | HMOM-TPHAP | BIR-PC | Ethyl lactate |
| Comparative Example 5 | 1-phenyl-1,2-butanedion-2-(o-methoxycarbonyl) oxime | None | BIR-PC | γ-butyrolactone Cyclopentanone |
| Comparative Example 6 | 1,2-octandione-1-[4-(phenylthio)phenyl]-2-(o-benzoyloxime) | NIKALAC MW-100LM | None | Diacetone alcohol |
| Comparative Example 7 | Bis(α-isonitrosopropiophenone oxime)isophthal | NIKALAC MX-270 | TrisP-PA | Ethyl lactate |
| Comparative Example 8 | Bis(α-isonitrosopropiophenone oxime)isophthal | NIKALAC MX-270 | TrisP-PA | Ethyl lactate |
| Comparative Example 9 | 2-benzyl-2-dimethylamino-1-(4-morpholinophenyl)-butan-1-one | DML-PC | None | 3-methyl-3-methoxybutanol |

TABLE 4

| | | o | p | q | r | s | t | α | β |
|---|---|---|---|---|---|---|---|---|---|
| Example | 1 | 1 | 1 | 0 | 3 | 3 | — | 0 | 0 |
| | 2 | 1 | 1 | 0 | 1 | 1 | — | 0 | 2 |
| | 3 | 1 | 0 | 0 | 2 | — | — | 0 | 2 |
| | 4 | 1 | 1 | 0 | 3 | 3 | — | 0 | 2 |
| | 5 | 1 | 1 | 0 | 2 | 2 | — | 0 | 2 |
| | 6 | 1 | 1 | 0 | 2 | 2 | — | 0 | 2 |
| | 7 | 1 | 0 | 0 | 2 | — | — | 0 | 2 |
| | 8 | 1 | 1 | 0 | 3 | 3 | — | 0 | 2 |
| | 9 | 1 | 1 | 0 | 8~9 | 8~9 | — | 0 | 0 |
| | 10 | 1 | 1 | 0 | 8~9 | 8~9 | — | 0 | 2 |
| | 11 | 1 | 1 | 0 | 2 | 2 | — | 0 | 2 |
| | 12 | 1 | 1 | 0 | 5 | 5 | — | 0 | 0 |
| | 13 | 1 | 1 | 0 | 3 | 3 | — | 0 | 0 |
| | 14 | 1 | 1 | 0 | 8~9 | 8~9 | — | 0 | 2 |
| | 15 | 1 | 1 | 0 | 1 | 1 | — | 0 | 2 |
| Comparative Example | 1 | 1 | 1 | 0 | 3 | 3 | — | — | — |
| | 2 | — | — | — | — | — | — | 0 | 2 |
| | 3 | — | — | — | — | — | — | 0 | 2 |
| | 4 | — | — | — | — | — | — | 0 | 2 |
| | 5 | — | — | — | — | — | — | 0 | 2 |
| | 6 | — | — | — | — | — | — | 0 | 2 |
| | 7 | 1 | 1 | — | 3 | 3 | — | — | — |
| | 8 | 1 | 1 | — | 3 | 3 | — | 0 | 0 |
| | 9 | 1 | 1 | — | 1 | 1 | — | 0 | 2 |

TABLE 5

| | Varnish | Heat treatment conditions | Alkaline developability | Residual film rate (%) | Shrinkage residual film rate (%) | Resolution (μm) | Breaking strength (MPa) | Elastic modulus (GPa) | Elongation at breakage (%) | Heat resistance (° C.) |
|---|---|---|---|---|---|---|---|---|---|---|
| Example 1 | A | 170° C. × 60 min | soluble in alkaline developing solution | 90 | 92 | 10 | 120 | 3.3 | 16 | 392 |
| Example 2 | B | 180° C. × 60 min | soluble in alkaline developing solution | 88 | 88 | 6 | 100 | 3.4 | 15 | 383 |
| Example 3 | C | 150° C. × 60 min | soluble in alkaline developing solution | 90 | 91 | 6 | 120 | 3.3 | 15 | 391 |
| Example 4 | D | 180° C. × 60 min | soluble in alkaline developing solution | 92 | 93 | 7 | 110 | 3.5 | 16 | 388 |
| Example 5 | E | 200° C. × 60 min | soluble in alkaline developing solution | 91 | 93 | 5 | 120 | 3.1 | 11 | 386 |
| Example 6 | F | 210° C. × 30 min | soluble in alkaline developing solution | 92 | 92 | 7 | 130 | 3.3 | 16 | 380 |

TABLE 5-continued

| | Varnish | Heat treatment conditions | Alkaline developability | Residual film rate (%) | Shrinkage residual film rate (%) | Resolution (μm) | Breaking strength (MPa) | Elastic modulus (GPa) | Elongation at breakage (%) | Heat resistance (° C.) |
|---|---|---|---|---|---|---|---|---|---|---|
| Example 7 | G | 150° C. × 60 min | soluble in alkaline developing solution | 91 | 93 | 5 | 120 | 3.4 | 14 | 391 |
| Example 8 | H | 180° C. × 60 min | soluble in alkaline developing solution | 92 | 92 | 10 | 100 | 3.4 | 16 | 383 |
| Example 9 | I | 180° C. × 30 min | soluble in alkaline developing solution | 91 | 90 | 7 | 110 | 3.5 | 11 | 398 |
| Example 10 | J | 180° C. × 30 min | soluble in alkaline developing solution | 92 | 90 | 5 | 120 | 3.1 | 16 | 385 |
| Example 11 | K | 210° C. × 30 min | soluble in alkaline developing solution | 88 | 83 | 7 | 100 | 3.0 | 11 | 378 |
| Example 12 | L | 200° C. × 60 min | soluble in alkaline developing solution | 86 | 86 | 10 | 120 | 3.2 | 15 | 384 |
| Example 13 | M | 170° C. × 60 min | soluble in alkaline developing solution | 90 | 85 | 7 | 130 | 3.3 | 13 | 388 |
| Example 14 | N | 180° C. × 60 min | soluble in alkaline developing solution | 88 | 89 | 6 | 110 | 3.3 | 12 | 386 |
| Example 15 | O | 180° C. × 60 min | soluble in alkaline developing solution | 88 | 88 | 6 | 110 | 3.3 | 13 | 390 |

TABLE 6

| | Varnish | Heat treatment conditions | Alkaline developability | Residual film rate (%) | Shrinkage residual film rate (%) | Resolution (μm) | Breaking strength (MPa) | Elastic modulus (GPa) | Elongation at breakage (%) | Heat resistance (° C.) |
|---|---|---|---|---|---|---|---|---|---|---|
| Comparative Example 1 | P | 170° C. × 60 min | soluble in alkaline developing solution | 81 | 75 | 20 | 80 | 2.8 | 7 | 377 |
| Comparative Example 2 | Q | 180° C. × 60 min | soluble in alkaline developing solution | 83 | 73 | 20 | 60 | 2.5 | 6 | 380 |
| Comparative Example 3 | R | 180° C. × 60 min | soluble in alkaline developing solution | 84 | 76 | 15 | 80 | 2.8 | 8 | 382 |
| Comparative Example 4 | S | 200° C. × 60 min | soluble in alkaline developing solution | 84 | 77 | 20 | 60 | 2.5 | 5 | 378 |
| Comparative Example 5 | T | 200° C. × 60 min | soluble in alkaline developing solution | 84 | 70 | 15 | 80 | 2.8 | 9 | 365 |
| Comparative Example 6 | U | 200° C. × 60 min | soluble in alkaline developing solution | 84 | 75 | 15 | 70 | 2.5 | 9 | 377 |
| Comparative Example 7 | W | 210° C. × 60 min | soluble in alkaline developing solution | 80 | 70 | 15 | 60 | 2.7 | 7 | 310 |

TABLE 6-continued

| | Varnish | Heat treatment conditions | Alkaline developability | Residual film rate (%) | Shrinkage residual film rate (%) | Resolution (μm) | Breaking strength (MPa) | Elastic modulus (GPa) | Elongation at breakage (%) | Heat resistance (° C.) |
|---|---|---|---|---|---|---|---|---|---|---|
| Comparative Example 8 | X | 170° C. × 60 min | soluble in alkaline developing solution | 90 | 92 | 30 | 120 | 3.3 | 16 | 392 |
| Comparative Example 9 | Y | 180° C. × 60 min | insoluble in alkaline developing solution | — | — | — | 100 | 3.4 | 15 | 383 |

INDUSTRIAL APPLICABILITY

According to the present invention, it is possible to obtain a photosensitive resin composition which enables development with an aqueous alkaline solution and does not require imidation of a polymer through a high-temperature heat treatment, and also has excellent pattern processability. Using this photosensitive resin composition, a heat resistant resin composition film, which has excellent heat resistance, strength and elongation, can be formed.

The heat resistant resin film formed of the photosensitive resin composition of the present invention can be used in applications such as a passivation film of a semiconductor, a protective film of a semiconductor device, an interlayer insulating film of a multilayer interconnection for high density mounting, a wiring protective insulating film of a circuit board, and a protective insulating film of an electrode on a substrate of a display device using an organic electroluminescence element.

The invention claimed is:

1. A photosensitive resin composition comprising:
   a polyimide (a) having, at the end of the main chain, at least one group selected from the group consisting of a carboxyl group, a phenolic hydroxyl group, a sulfonic acid group and a thiol group;
   an unsaturated bond-containing polymerizable compound (b1) represented by the general formula (1); and
   a photopolymerization initiator (c):

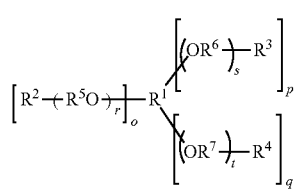

(1)

wherein $R^1$ represents a mono- to tri-valent organic group having at least one aromatic ring; $R^2$ to $R^4$ represent a polymerizable group having an unsaturated bond; $R^5$ to $R^7$ represent a di-valent organic group; $R^2$ to $R^4$ and $R^5$ to $R^7$ may be the same or different; o, p and q represent an integer from 0 to 1; and r, s and t each independently represents an integer from 1 to 10, provided that $o+p+q \geq 1$;

wherein the polyimide as the component (a) contains at least one polyimide selected from those of the general formulas (2) to (5) in an amount of 10% by weight or more based on the entire polyimide:

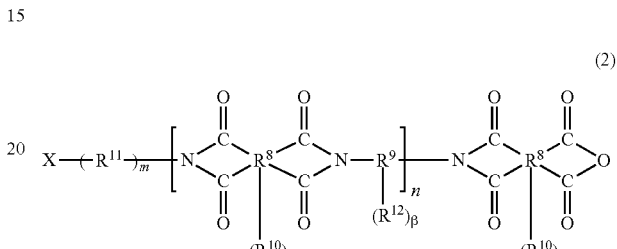

(2)

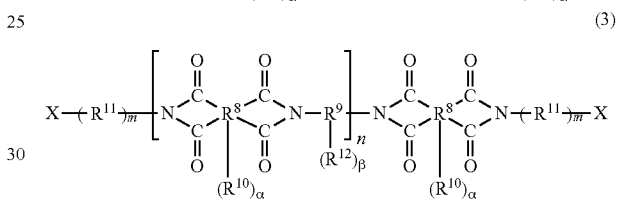

(3)

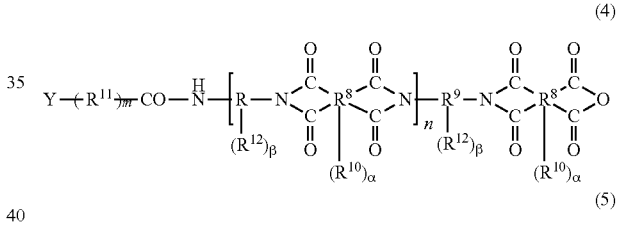

(4)

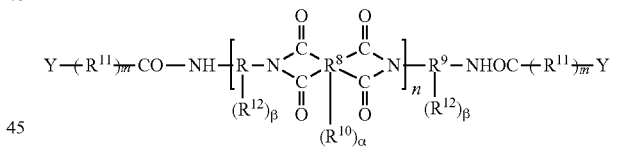

(5)

wherein $R^8$ represents a tetra- to tetradeca-valent organic group; $R^9$ represents a di- to dodeca-valent organic group; $R^{10}$ and $R^{12}$ represent a hydrogen atom, or an organic group having at least one group selected from the group consisting of a phenolic hydroxyl group, a sulfonic acid group, a thiol group and an organic group having 1 to 20 carbon atoms, and may be the same or different; $R^{11}$ represents a noncyclic di-valent organic group; X represents a mono-valent aromatic group or cyclic aliphatic group, which has at least one group selected from the group consisting of a carboxyl group, a phenolic hydroxyl group, a sulfonic acid group and a thiol group; Y represents a mono-valent organic group having at least one group selected from the group consisting of a carboxyl group, a phenolic hydroxyl group, a sulfonic acid group and a thiol group; n is within a range from 3 to 200; and m, α and β each independently represents an integer from 0 to 10, and; in the general formulas (2) and (3), —N—$(R^{11})_m$—X has a structure represented by the following general formula (7), and in the general formulas (4) and (5), —CO—$(R^{11})_m$—Y has a structure represented by the following general formula (8) or (9):

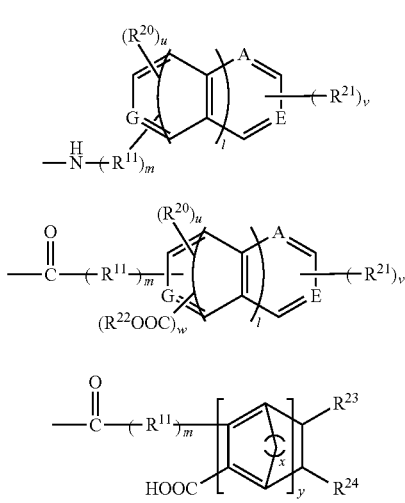

wherein $R^{11}$ represents a noncyclic di-valent organic group selected from the group consisting of —$CR^{25}R^{26}$—, —$CH_2O$— and —$CH_2SO_2$—; $R^{25}$ and $R^{26}$ represent a mono-valent group selected from the group consisting of a hydrogen atom, a hydroxyl group and a hydrocarbon group having 1 to 10 carbon atoms; $R^{20}$ and $R^{21}$ each represents a group selected from the group consisting of a hydrogen atom, a hydroxyl group, a carboxyl group, a sulfonic acid group, a thiol group and a hydrocarbon group having 1 to 10 carbon atoms, and at least one of them is a hydroxyl group, a carboxyl group, a sulfonic acid group or a thiol group; $R^{22}$ represents a mono-valent group selected from the group consisting of a hydrogen atom and a hydrocarbon group having 1 to 10 carbon atoms; $R^{23}$ and $R^{24}$ each represents a mono-valent group selected from the group consisting of a hydrogen atom and a hydrocarbon group having 1 to 4 carbon atoms, or a ring structure formed by direct bonding of $R^{23}$ and $R^{24}$; A, E and G each represents a carbon atom or a nitrogen atom and may be the same or different; m is an integer from 0 to 10; l is 0 or 1; u is 0 or 1; v is an integer from 1 to 3; w is 0 or 1; x and y each represents 0 or 1.

2. The photosensitive resin composition according to claim 1, which further contains an unsaturated bond-containing polymerizable compound (b2) having an alicyclic hydrocarbon group.

3. The photosensitive resin composition according to claim 1, which further contains a thermocrosslinkable compound (d).

4. The photosensitive resin composition according to claim 1, wherein m of the general formulas (2) to (5) is 0.

5. The photosensitive resin composition according to claim 3, wherein the thermocrosslinkable compound as the component (d) has an organic group represented by the general formula (6):

[Chemical Formula 3]

wherein $R^{13}$ represents a hydrogen atom, an alkyl group having 1 to 20 carbon atoms, an alicyclic hydrocarbon group having 4 to 20 carbon atoms or $R^{14}CO$ group; and $R^{14}$ represents an alkyl group having 1 to 20 carbon atoms.

* * * * *